(12) United States Patent
Mandelman et al.

(10) Patent No.: US 6,440,872 B1
(45) Date of Patent: Aug. 27, 2002

(54) METHOD FOR HYBRID DRAM CELL UTILIZING CONFINED STRAP ISOLATION

(75) Inventors: Jack A. Mandelman, Stormville; Ramachandra Divakaruni, Somers; Carl J. Radens, LaGrangeville; Stephan Kudelka, Fishkill, all of NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 09/706,468

(22) Filed: Nov. 3, 2000

(51) Int. Cl.[7] .................................. H01L 21/00
(52) U.S. Cl. ................ 438/745; 438/753; 438/757
(58) Field of Search ................... 438/692, 712, 438/719, 723, 735, 743, 745, 753, 757, 38; 216/67, 79, 88, 99

(56) References Cited

U.S. PATENT DOCUMENTS 6,214,741 B1 * 4/2001 Lee ........................... 438/719
6,287,971 B1 * 9/2001 Park et al. ............... 438/719 X

* cited by examiner

Primary Examiner—William A. Powell
(74) Attorney, Agent, or Firm—Scully, Scott, Murphy & Presser; Todd M. C. Li

(57) ABSTRACT

A process of forming a hybrid memory cell which is scalable to a minimum feature size, F, of about 60 nm at an operating voltage of $V_{blh}$ of about 1.5 V and substantially free of floating-well effects.

15 Claims, 24 Drawing Sheets

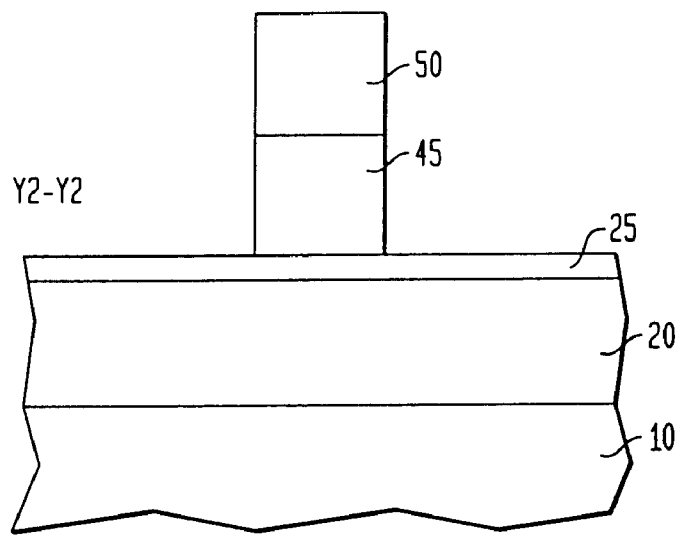
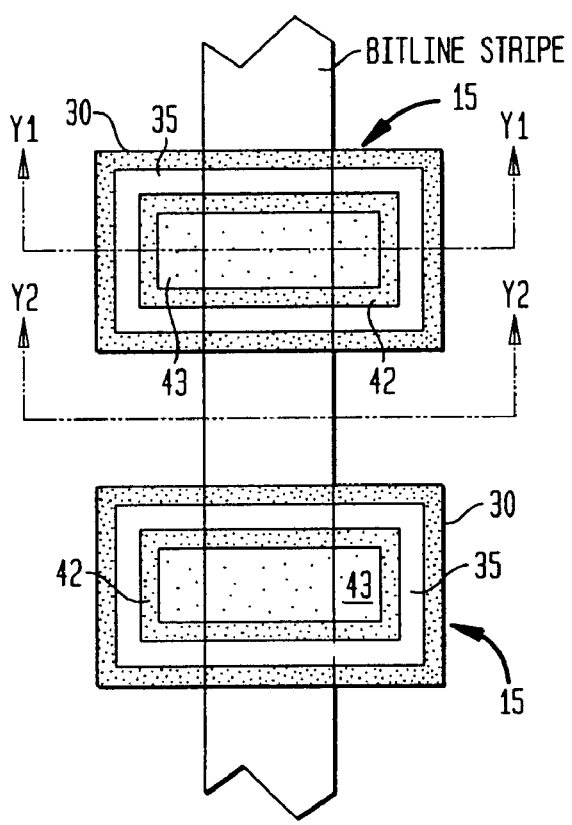

FIG. 8B1

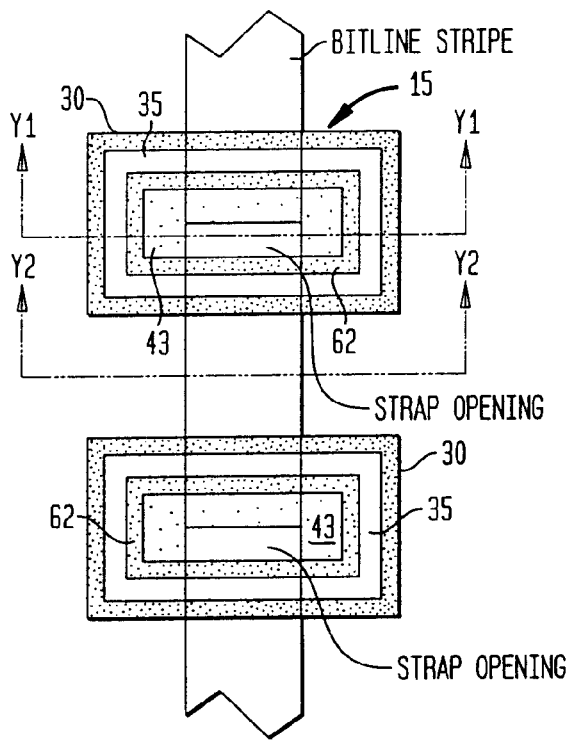
FIG. 9A
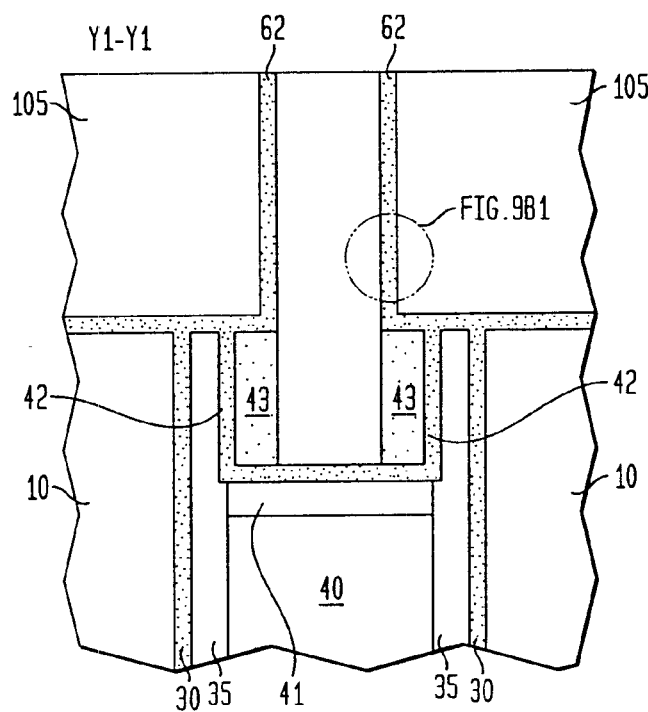
FIG. 9B
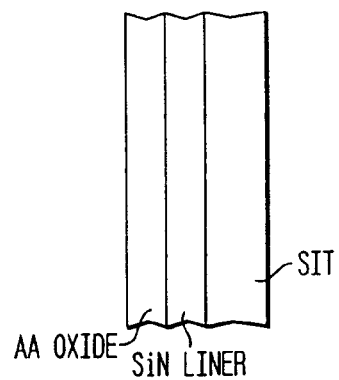
FIG. 9B1

FIG. 10B1

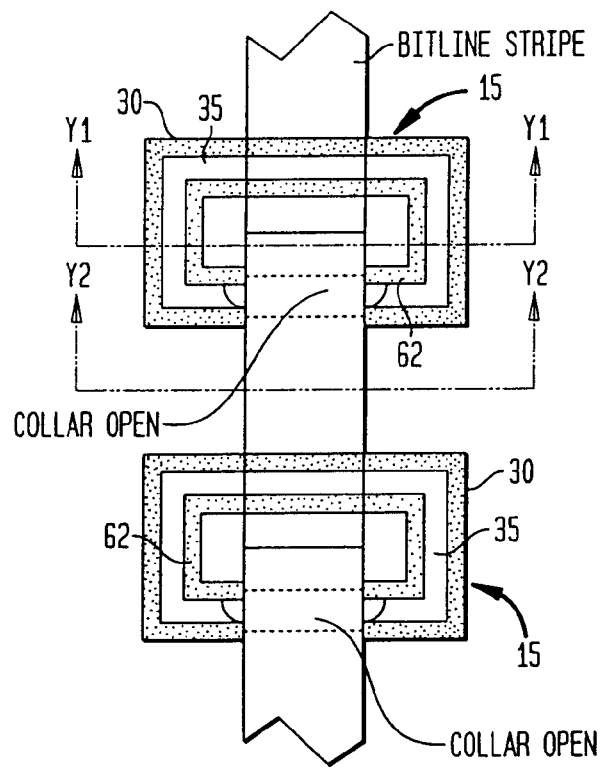
FIG. 11A
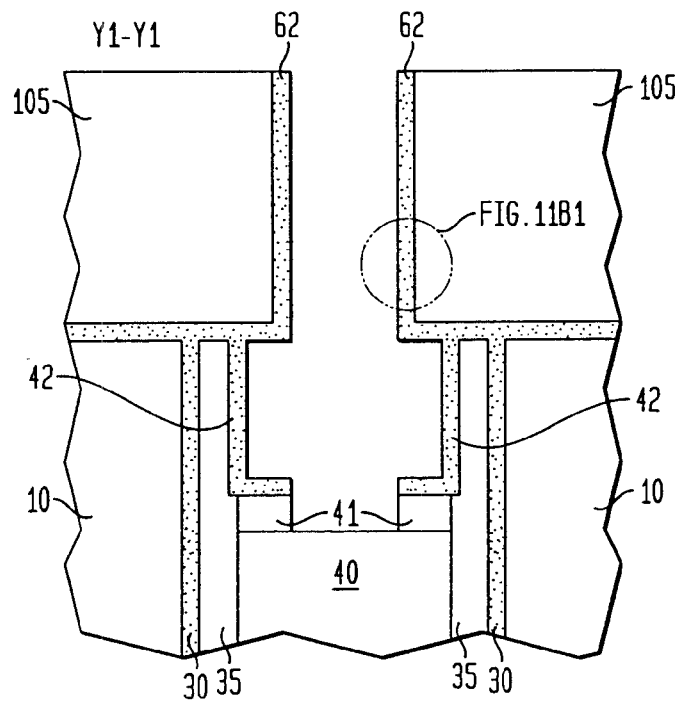
FIG. 11B
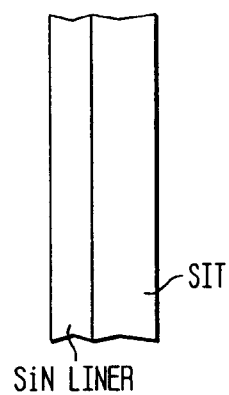
FIG. 11B1

METHOD FOR HYBRID DRAM CELL UTILIZING CONFINED STRAP ISOLATION

RELATED APPLICATIONS

This application is related to co-assigned U.S. patent applications Ser. Nos. 09/706,482 and 09/705,652, now U.S. Pat. No. 6,284,593, issued on Sep. 4, 2001, both of which were filed concurrently with this application.

FIELD OF THE INVENTION

The present invention relates to semiconductor memory cells, and more particular to a process for forming an ultra-scalable hybrid-type memory cell array. Specifically, the present invention is directed to a process of forming a hybrid-type memory cell array which is scalable to a minimum feature size, F, of about 60 nm at operating voltages of $V_{blh}$ of about 1.5V.

BACKGROUND OF THE INVENTION

As conventional vertical DRAM cells are scaled below a design groundrule of about 110 nm, encroachment of the buried-strap region upon the sidewall of the adjacent storage trench cuts-off the path holes flowing into and out of the portion of the P-well above the buried-strap region.

Simulation has demonstrated that floating-well effects limit the scalability of prior art vertical DRAM memory arrays to a minimum distance of about 90 nm between adjacent storage trenches. A number of dynamic leakage mechanisms limiting the scalability of conventional vertical DRAM memory cells have been identified and quantified. Included in the dynamic leakage mechanisms are: (1) Floating-well bitline disturb (FWBD), (2) Transient drain induced barrier lowering (TDIBL), and (3) Adjacent word-line induced punchthrough (AWIPT).

The onset of serious charge loss due to each mechanism occurs at approximately 90 nm end of process deep trench (DT) to deep trench (DT) spacing. Thus, scalability of conventional vertical DRAM memory cells beyond 110 nm is expected to be limited by floating-well effects.

An illustration of a dominant floating-well dynamic leakage mechanism that limits scalability of prior art vertical DRAM memory arrays is shown in FIG. 1. Specifically, at a time indicated by point A of FIG. 1 and during a long period of about 5–100 ns of repeated writing of a "1" to other memory cells on the bitline, the P-well of an unselected cell storing a "1" may leak up towards bitline voltage ($V_{blh}$), as the exiting of holes is restricted by parasitic JFET. Leakage depends on the degree of well isolation caused by pinchoff from expansion of the storage node depletion region. In an extreme case, the buried-strap region may come in contact with the adjacent deep trench capacitor. Moreover, the hole current through the pinchoff region must keep up with the leakage to avoid a pseudo "Floating-Body Effect".

Insofar as time interval B-C is concerned, the N+ bitline diffusion to P-well barrier is lowered by a downward swing of $V_{blh}$. Electrons emitted from the bitline diffusion region are collected by the storage node resulting in the formation of a parasitic bipolar transistor, $Q_B$, ($PW_{int}$ is a floating base) within the memory cell array.

For aggressively scaled vertical metal oxide semiconductor field effect transistors (MOSFETs) in prior art vertical DRAM memory cells, the depletion region from the storage node diffusion (i.e., buried-strap outdiffusion) encroaches upon the sidewall of the adjacent storage trench, which results in dynamic charge loss from the storage capacitor as the bitline of an unselected device is cycled. This charge loss mechanism is identical to that published in "Floating-Body Concerns for SOI Dynamic Random Access Memory (DRAM)", Proceedings, 1996 IEEE International SOI Conference, Jack Mandelman, et al. pp. 1367–137, October 1996.

An illustration of the storage capacitor voltage vs. the voltage in the portion of the P-well isolated by the depletion region from the buried-strap outdiffusion, as the bitline is cycled, is shown in FIG. 2. When the bitline is held at $V_{blh}$, the isolation portion of the P-well leaks up towards the voltage of the adjacent diffusions. With subsequent cycling of the bitline between 0.0 and $V_{blh}$, the dynamic charge loss mechanism results in charge pumping which discharges the storage capacitor. Between data refresh, greater than $10^6$ bitline cycles are possible, which is sufficient to discharge the storage capacitor.

One possible solution to the scalability limitation resulting from floating-well effects, which has not yet been implemented in existing memory structures, includes a contact to the portion of the P-well above the buried-strap outdiffusion region. If such a memory structure is possible, it must be provided in a manner that does not negatively impact cell density, does not degrade junction leakage, and does not add to the fabrication complexity. To date, applicants are unaware of a prior art vertical DRAM memory structure of this type that overcomes the scalability limitation resulting from floating-well effects.

The present invention provides a processing scheme which provides a contacted body and maintains low junction leakage, while actually reducing fabrication cost, retarding the onset of scalability limitations due to floating-well effects to approximately 60 nm groundrules.

SUMMARY OF THE INVENTION

One object of the present invention is to provide a process of forming a hybrid memory cell array ($6F^2$) which avoids strap-to-strap leakage problems to a minimum feature size, F, of about 60 nm at operating voltages of $V_{blh}$ of about 1.5 V.

Another object of the present invention is to provide a process of forming a hybrid memory cell array wherein the floating-well effects are substantially eliminated.

A further object of the present invention is to provide a process of forming a hybrid memory cell array which has tighter support groundrules.

A still further object of the present invention is to provide a process of forming a hybrid memory cell array in which a low-aspect ratio shallow isolation trench (SIT) region is employed.

A yet further object of the present invention is to provide a process of forming a hybrid memory cell array having improved narrow width effects.

An even further object of the present invention is to provide a process of forming a hybrid memory cell array wherein the spaces between the SIT regions may be greater than 1F without critical overlay in the array.

These and other objects and advantages are achieved by employing the process of the present invention which includes the steps of:

(a) forming at least one deep trench capacitor in a Si-containing substrate, said at least one deep trench capacitor including at least a deep trench polysilicon material, a trench oxide formed on said deep trench polysilicon material, a liner formed on said trench oxide and interior walls of a collar oxide region; and a polysilicon placeholder material formed on the liner;

(b) patterning said polysilicon placeholder material using at least a hardmask to cover a middle portion of said deep trench capacitor;

(c) etching areas not covered by said hard mask and forming a oxide/nitride liner on all exposed surfaces provided by said etching;

(d) forming a planarized layer of oxide in said etched areas on said oxide/nitride liner so as to form shallow isolation trench regions which have a depth that is substantially above a buried-strap outdiffusion region to be subsequently formed thereby not cutting into said buried-strap outdiffusion region, yet being deep enough to isolation adjacent bitline diffusion regions to be subsequently formed;

(e) removing said hard mask from said middle portion of the deep trench capacitor, and selectively etching through a portion of said polysilicon placeholder material, liner and trench oxide so as to expose a portion of said deep trench polysilicon material;

(f) providing a strap opening in said deep trench capacitor and forming a one-sided buried-strap outdiffusion region through said strap opening, said one-sided buried strap outdiffusion region being confined to a substantially center portion of the deep trench capacitor;

(g) forming a trench oxide so as to cover said exposed deep trench polysilicon material and forming a planarized gate conductor material in previous etched areas of said deep trench; and (h) forming bitline diffusion regions about said deep trench capacitor.

The inventive process further comprises forming wordlines above said deep trench capacitor, forming borderless bitline contacts adjacent to said wordlines and forming bitlines above and perpendicular to said wordlines that are in contact with said bitline contacts.

BRIEF DESCRIPTION OF THE DRAWINGS

FIG. 5A is a graph of mid-band electron potential (V) vs. lateral distance ($\mu$m); while

In FIGS. 6–17, top views are shown as well as cross-sectionals through various cuts including through the deep trench region, Y1-Y1, and through the SIT region, Y2-Y2. In some instances, a cut through the cross-section perpendicular to Y1-Y1 and Y2-Y2, i.e., X-X is shown. Cut X-X is in a plane containing both storage trench and the body of the vertical MOSFET.

DETAILED DESCRIPTION OF THE INVENTION

Figure 1:
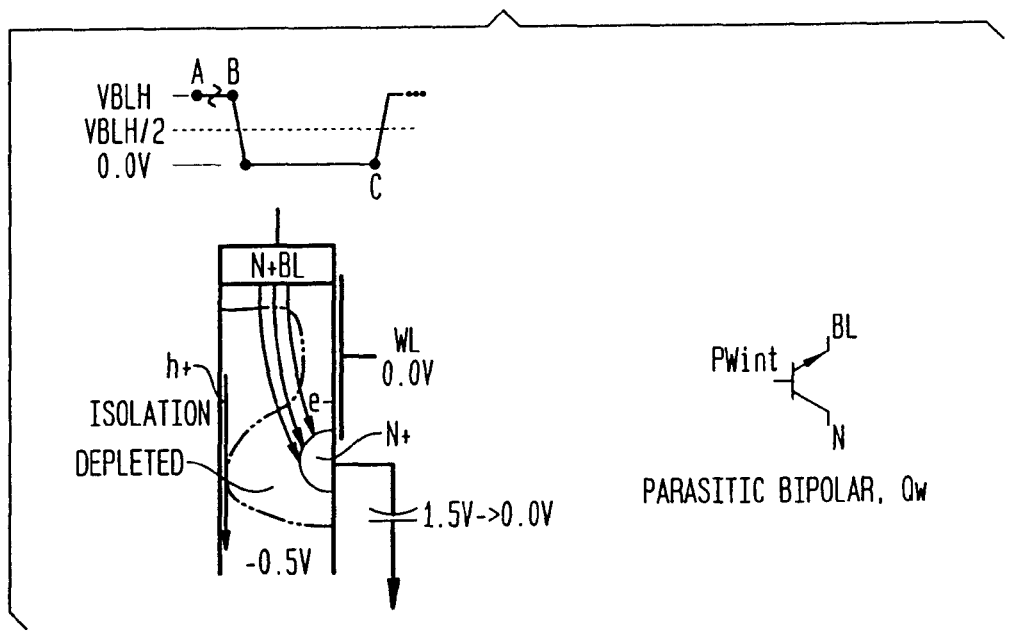
FIG. 1 is schematic that explains the floating well-effects in a conventional hybrid memory cell.
Figure 2:
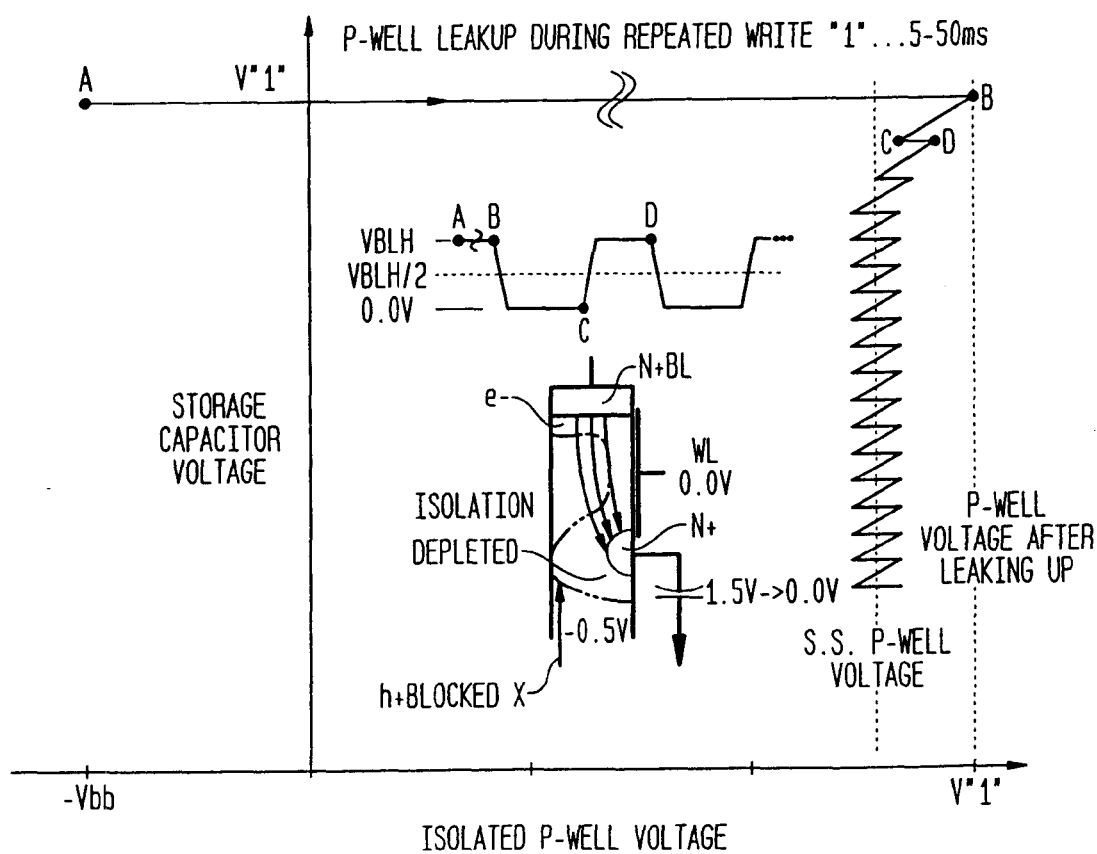
FIG. 2 is an illustration of storage capacitor charge loss with repeated bitline cycling in an unselected conventional hybrid memory cell.

The present invention which provides a process of forming a hybrid dynamic random access memory (DRAM) cell array which avoids stored charge loss due to floating-well effects to a feature size of about 60 nm at an operating voltage of $V_{blh}$ of about 1.5 V will now described in greater detail by referring to the drawings that accompany the present application.

Figure 3A:
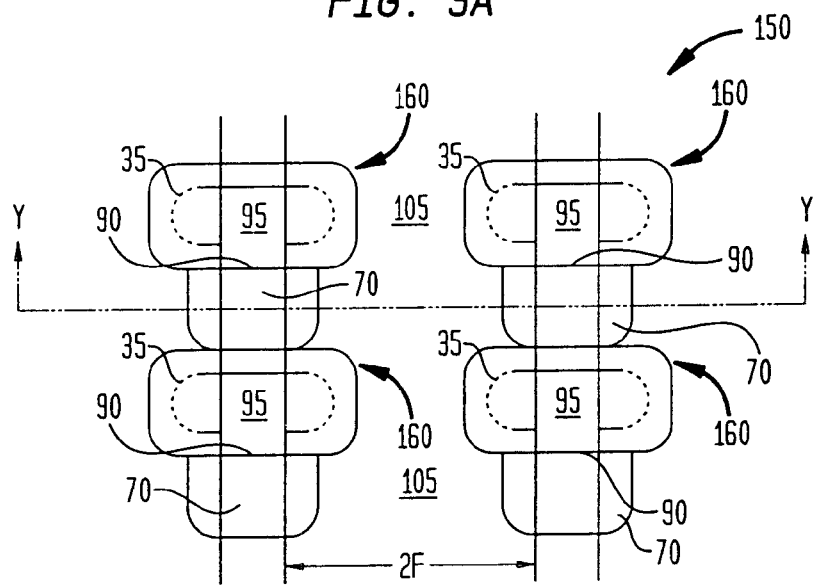
FIGS. 3A–B are pictorial representations of a portion of the inventive hybrid memory cell.
Figure 3B:
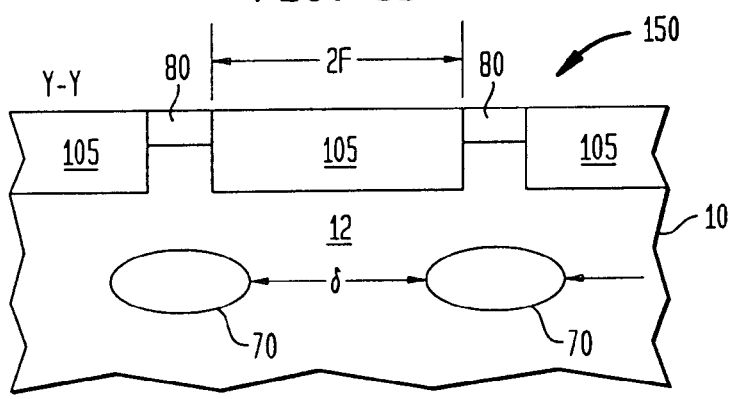

Reference is made to FIGS. 3A–B that illustrate a portion of the inventive ultra-scalable hybrid memory cell array. Specifically, FIG. 3A is a top view of the inventive hybrid memory cell array 150 which includes a plurality of vertical DRAM cells 160 arranged in rows and columns. In FIG. 3A, the illustrated elements of the vertical DRAM include gate conductor 95, gate oxide 90 and collar oxide 35 which is formed entirely around the gate conductor expect for a small aperture in which buried-strap region 70 and channel of the vertical MOSFET are present. In accordance with the present invention, each vertical memory cell, i.e., DRAM, is formed in a storage trench that is present in a P-well of a Si-containing substrate and each vertical memory cell includes a MOSFET region formed over a storage capacitor. The MOSFET region and the storage capacitor of the inventive memory cell array are electrically connected to each other by a one-sided buried-strap outdiffusion region 70. The one-sided buried-strap outdiffusion region is confined to a substantially center portion of the storage trench and it may extend essentially to the adjacent vertically memory cell present in the same column.

The memory cell shown in FIG. 3A also includes shallow isolation trench (SIT) regions 105 located between adjacent columns of memory cells. In accordance with the present invention, each shallow isolation trench region has a depth that is substantially above the one-sided buried-strap outdiffusion region thereby not cutting into the one-sided buried-strap outdiffusion region, yet being deep enough to isolation adjacent bitline diffusion regions that abut each vertical memory cell; See FIG. 3B.

Specifically, FIG. 3B is a cross-sectional view of the hybrid memory cell through cut Y-Y, i.e., the N+ buried-strap diffusion region. As shown, the hybrid memory cell includes SIT regions 105 which are formed in a P-well region 12 of a Si-containing substrate 10. Bitline diffusion regions 80 are located in the P-well region between each STI region beneath each bitline diffusion, is buried-trap outdiffusion region 70.

It should be noted that there are several novel features contained in the above cell which allow a contact to the P-well (above the strap) to be formed without impacting junction leakage, cell area and fabrication cost. Included are (1) The collar oxide covers the entire perimeter of the top portion of the storage trench except for a 1F wide opening which contains the strap and gate oxide of the vertical metal oxide semiconductor field effect transistor (MOSFET); and (2) The shallow isolation trench regions, e.g., SIT regions, are just deep enough to cut the bitline difflusion (and the source/drain diffusions in the support circuitry, not shown). In the inventive hybrid memory cell array, the bottom of the SIT is substantially above the top portion of the strap diffusion. This means that a greatly reduced aspect ratio SIT may be used in the supports circuitry as well as the array, facilitating etching and filling, while allowing tighter groundrules. Furthermore, since the bottom of the SIT region is now well above the strap diffusion, sub-trench isolation leakage is better controlled with a higher doping concentration without increasing the background doping at the strap.

Figure 4:
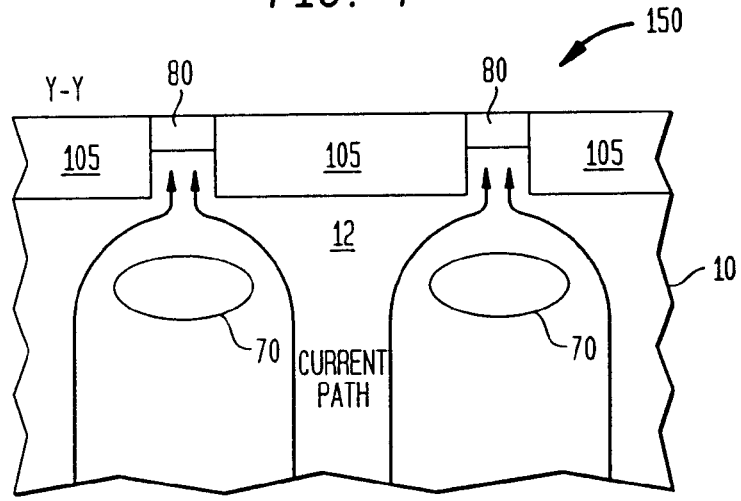
FIG. 4 is an illustration showing the electrical continuity to the upper portion of the P-well.

As shown in FIG. 4, electrical continuity between the deep portion of the P-well (biased at $V_{bb}$, typically –0.5V) and the portion of the P-well above the strap is obtained by hole flow around the depletion region surrounding the strap diffusion. In accordance with the present invention, the SIT regions are sufficiently shallow (greater than 40 nm above the strap diffusion junction) to allow a non-depletion portion of the P-well to remain between the strap diffusion and the bottom of the SIT. Since the conductive region which provides P-well continuity is original single crystal silicon, junction leakage due to a depletion region abutting a polycrystalline contact is not a concern.

An additional benefit resulting from shallower isolation regions, i.e., SIT regions, is that the space between SIT regions may be greater than about 1F, eliminating critical overlay, since the strap aperture (i.e., opening) is no longer defined by the isolation trenches. This allows relaxed groundrules and larger bitline contact area. One remaining question which needs to be addressed is how close (δ) may the adjacent strap diffusion be without exceeding a punch-through current of about 1 fA/μm.

Figure 5A:
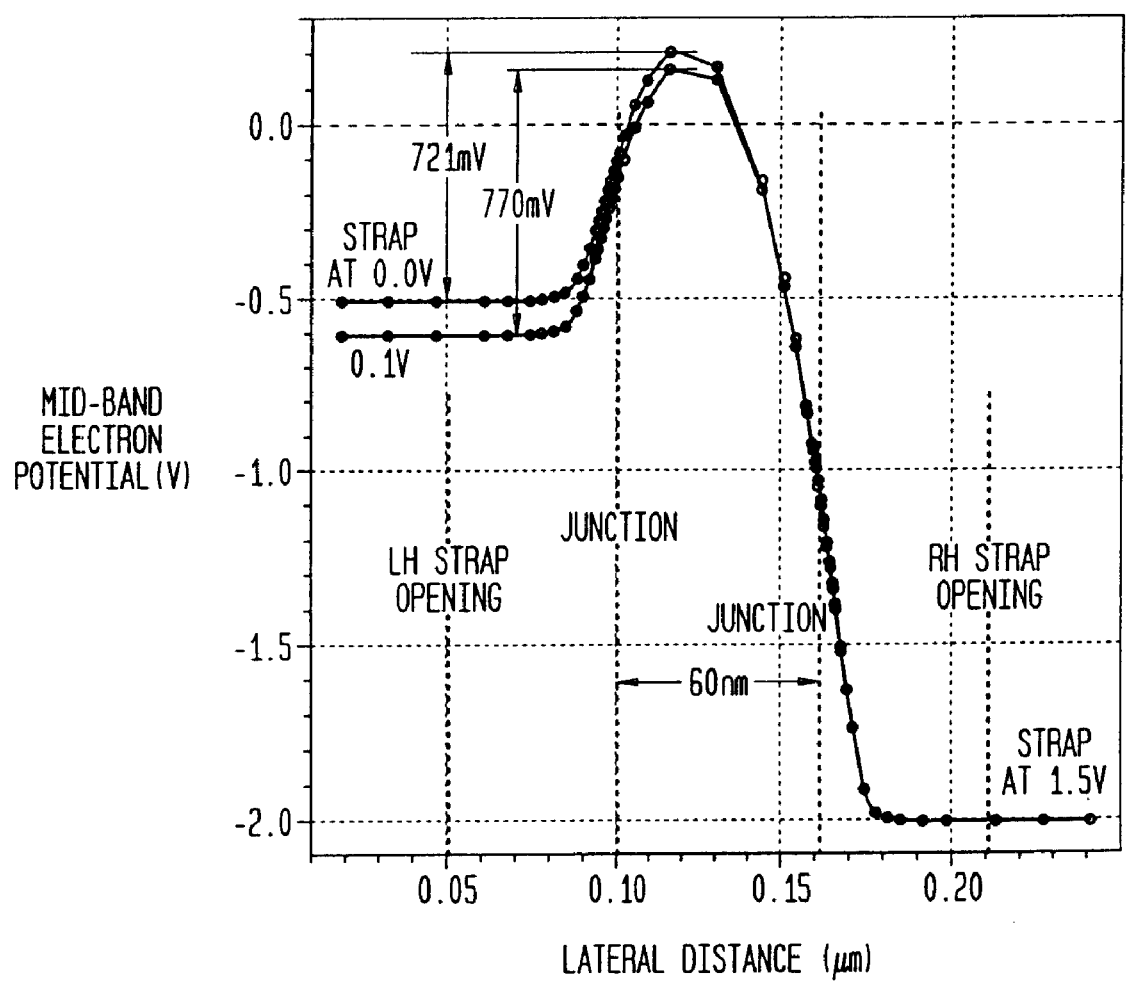

Simulations have demonstrated that, with the thermal budget practiced for conventional hybrid cells of the prior art, the amount of strap outdiffusion normal to the sidewall of the storage trench can easily be limited by approximately 50 nm. It has been further found that the amount of diffusion tangential to the sidewall of the storage trench is approximately 30 nm. Using the above value for tangential outdiffusion, and referring again to FIG. 3, applicants have deduced that a spacing between strap diffusions, δ, of about 2F–60 nm, wherein F is the minimum feature size, can be employed. As can be seen from the simulated potential between straps in FIG. 5A, lowest strap-strap punchthrough barrier occurs when the low-node is zero, for a constant voltage on the adjacent strap, due to drain induced barrier lowering. This means that the highest strap-strap leakage occurs when a "1" is stored on one node and 0.0 V on the adjacent node.

Figure 5B:
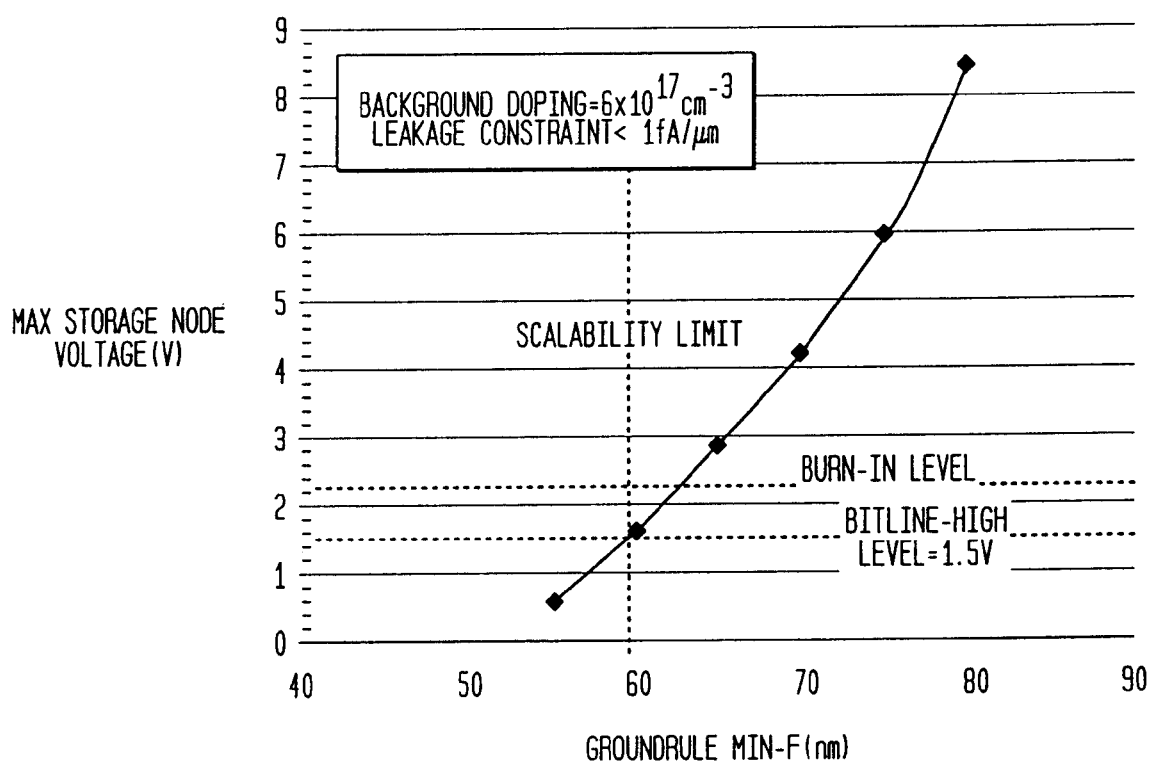
FIG. 5B is a graph of maximum storage node voltage (V) vs. groundrule minimum-F (nm).

FIG. 5B plots simulated results of the maximum voltage which can be applied to one strap diffusion (storage node voltage), with the adjacent strap diffusion held at zero volts, to produce a leakage current of about 1 fA/μm, as a function of the feature size, F. The empirical P-well doping constraint of about $6-10^{17} cm^3$ has been applied to assure that the tail of retention time distribution is not degraded by defect enhanced junction leakage. As can be seen in FIG. 5B, the leakage constraint is satisfied for a stored "1" of about 1.5 V for a design groundrule smaller than about 60 nm. This corresponds to a diffusion spacing (δ) of about 58 nm. Therefore, acceptable diffusion to diffusion leakage obtained without the usage of prior art isolation trenches, i.e., STIs, for spacing smaller than about 60 nm, which is an unexpected result that enables extreme scaling of the inventive hybrid cell.

The processing scheme, which is employed in the present invention in fabricating the above-described ultra-scalable hybrid memory cell array, will now be described in detail by referring to FIGS. 6–17 which illustrate the various processing steps of the present invention. As stated above, top views are shown as well as cross-sectional views through various cuts including through the deep trench region, Y1-Y1, and through the SIT region, Y2-Y2. In some instances, a cut through the deep trench and vertical MOSFET body regions, X-X is shown.

Figure 6A:
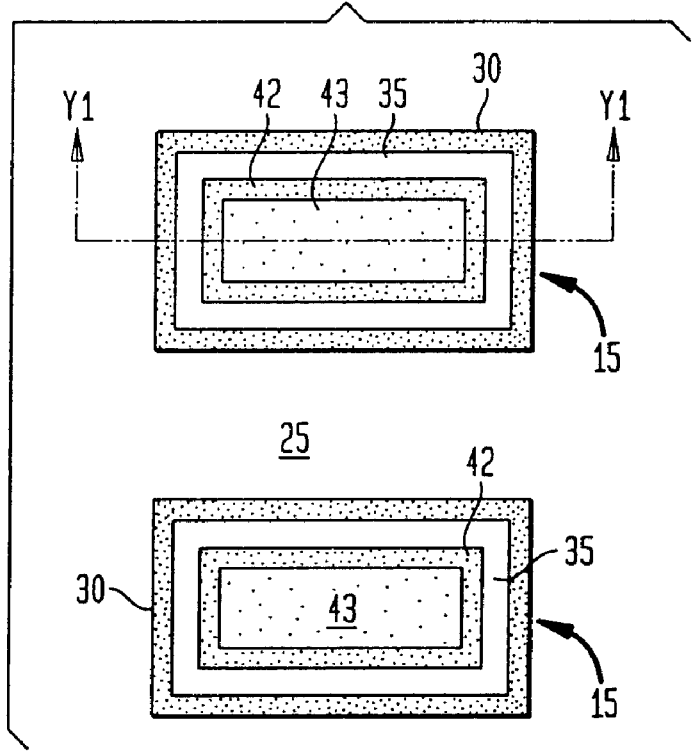
FIGS. 6–17 are pictorial views illustrating the inventive hybrid memory cell through various processing steps of the present invention.

Reference is made to FIGS. 6A (top view) and 6B (cross-sectional through cut Y1-Y1) which illustrate one of the deep trench capacitors of the inventive hybrid memory cell. It is noted that only the upper region (above the node dielectric) of the storage trench is shown in the drawings. Specifically, the deep trench capacitor shown in FIGS. 6A–6B includes a Si-containing substrate 10 having a least one deep trench 15 formed therein. The term "deep trench" is used herein to denote a trench whose depth from the top surface of the Si-containing substrate is from about 1.0 μm or greater. The deep trench capacitor structure also includes a horizontal pad SiN layer 20 and a thin oxide layer 25 formed on said structure. In accordance with the present invention, the thin oxide layer has a thickness of about 15 nm or less, and it is comprised of denisfied TEOS (tetraethylorthosilicate) or a high density plasma (HDP) oxide.

The deep trench region includes a first SiN layer 30 which lines the exposed walls (sidewalls and bottom wall) of the deep trench, a collar oxide region 35 formed in a portion of the deep trench on said first SiN liner, deep trench polysilicon 40 formed in a lower portion of the deep trench, a trench oxide 41 formed on a horizontal surface of said deep trench polysilicon, a second SiN liner 42 lining exposed walls of said collar oxide and the surface of the trench oxide, and a polysilcion placeholder material 43 formed in the upper region of the deep trench. The SiN liners herein may be replaced with other liner materials which serve as an etch stop layer.

Figure 6B:
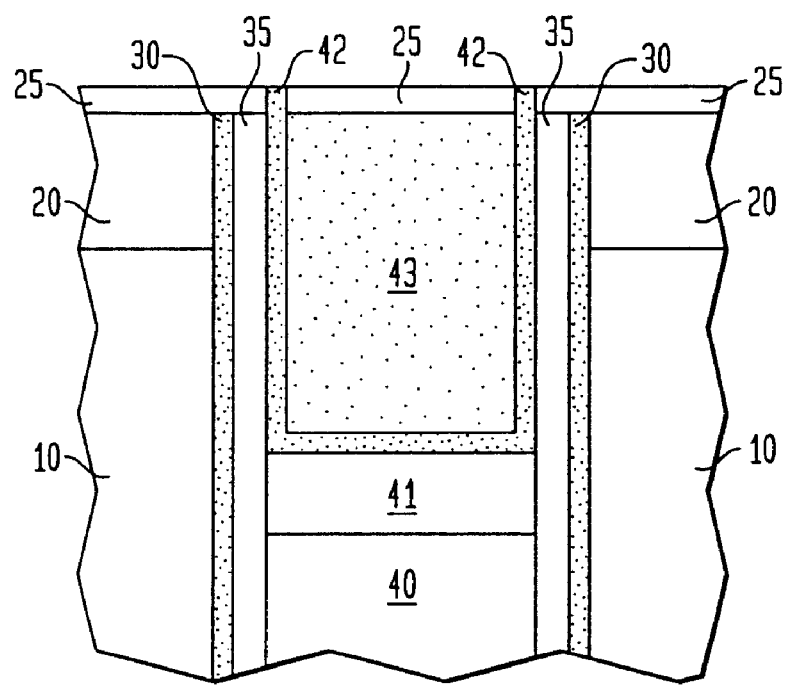
Figure 7A:
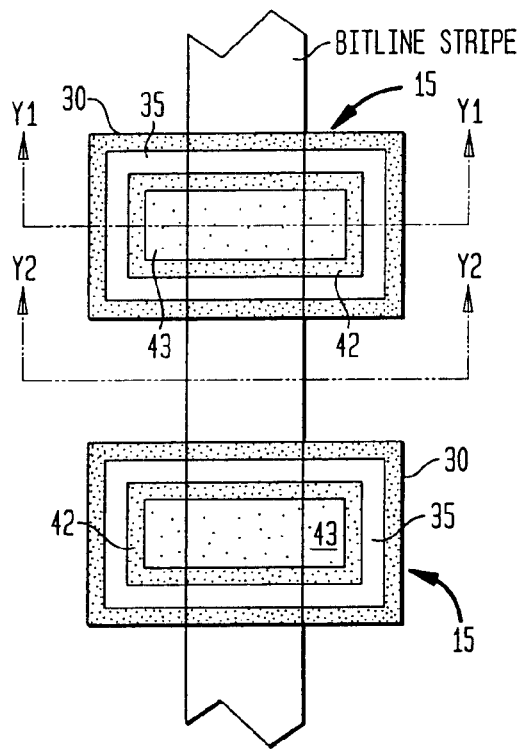
Figure 7B:
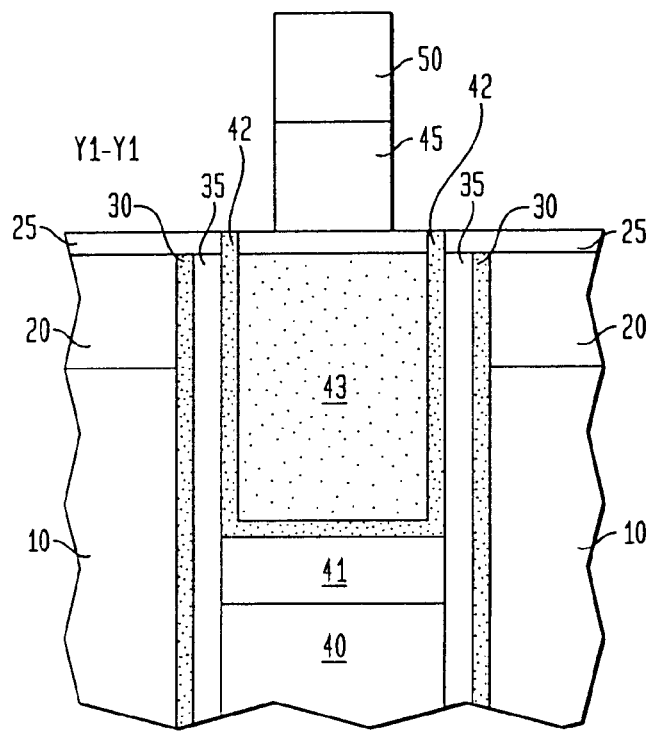
Figure 8B:
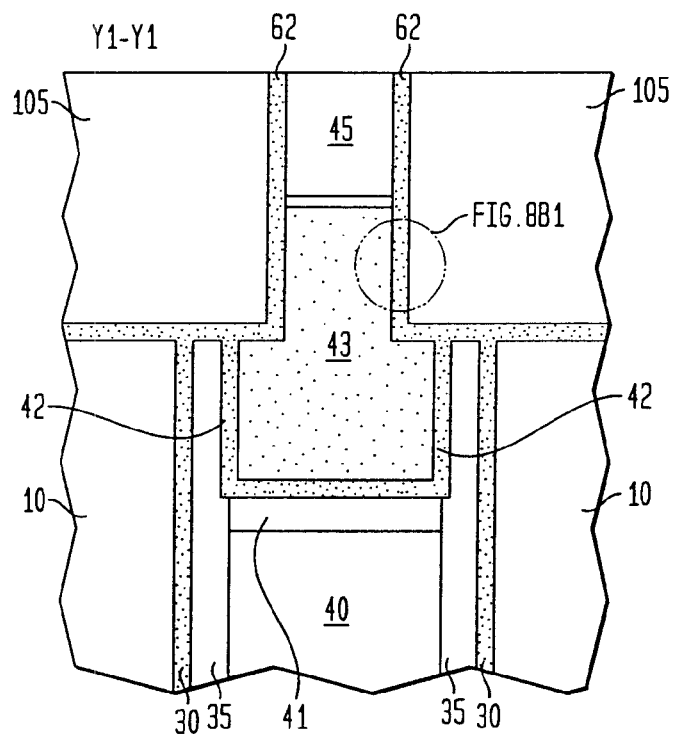
Figure 8C:
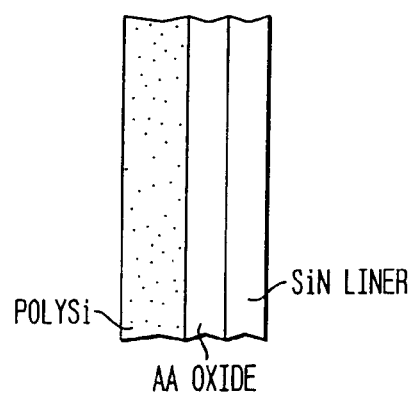
Figure 8C:
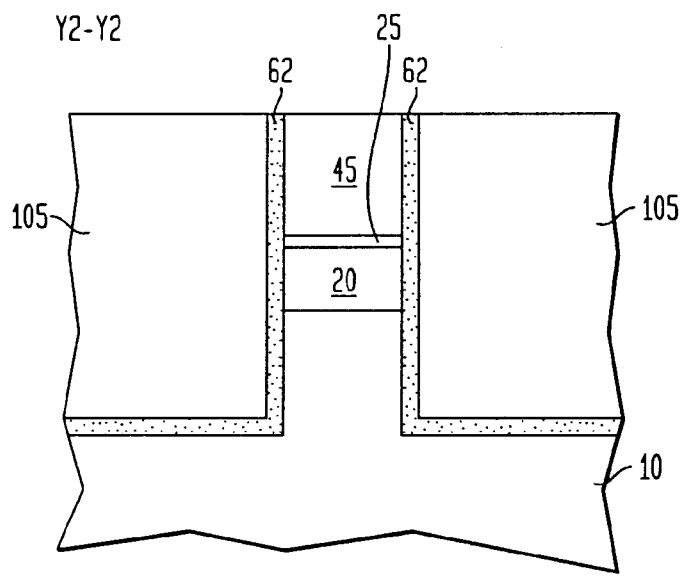

The deep trench structure shown in FIGS. 6A–6B is formed utilizing the following processing steps: First, a pad structure consisting of a thin (5 nm or less) thermally grown oxide (not shown), a deposited layer of SiN 20, and a customary TEOS or boron silicate glass (BSG) hardmask layer is formed on the surface of the Si-containing substrate Deep trench storage capacitors, one of which is shown in drawings, are then formed in the customarily practiced manner of opening a trench pattern in the pad structure via lithography and anisotropically etching the Si-containing substrate to a predetermined depth. The trench opening is then lined with first SiN liner 30. Next, a polysilicon buffered LOCOS (local oxidation of silicon) collar or other type of collar oxide 35 is formed in a portion of the deep trench, a buried plate diffusion (not shown) is formed in a lower portion of the deep trench, and a node dielectric layer (not shown) is formed about said buried plate diffusion. The trench is filled with doped polysilicon (i.e., deep trench polysilicon) 40 and planarized utilizing a conventional planarization process such as chemical-mechanical polishing (CMP). The deep trench polysilicon is recessed by conventional means to a depth which is desired for the strap (determines the channel length of the vertical metal oxide semiconductor field effect transistors (MOSFETs)). A layer of oxide (i.e., trench oxide) such as HDP oxide 41 is deposited to a thickness of from about 10 to about 50 nm on the surface of the recessed deep trench polysilicon. Second nitride liner 42 is thereafter deposited in the deep trench so as to line the exposed wall of the collar oxide and on the surface of the trench oxide.

Polysilicon placeholder material 43 is then deposited and planarized to the top surface of pad SiN layer 20. The planarization process removes substantially the entire oxide and most of the TEOS or BSG hardmask from the stack structure. Any residual TEOS or BSG hardmask may be removed with a chemical etchant such as HF/sulfuric acid or HF vapor. Thin oxide layer 25, which serves as a hard mask, is next deposited by a conventional deposition process. FIGS. 6A–6B show the resultant structure at this point of the inventive process.

After forming the deep trench capacitor structure in the Si-containing substrate, another layer of SiN 45 is deposited on the horizontal surface of the structure by a conventional deposition process and thereafter photoresist 50 or optional hardmask and photoresist is formed on SiN layer 45. The photoresist is then exposed and patterned into lines and spaces. The intersection of photoresist lines will subsequently define the location of the strap opening and the gate of the vertical MOSFET. Using the photoresist stripes as a mask, SiN layer 45 is anisotropically etched selective to $SiO_2$ and silicon, stopping on the oxide layer providing the structure shown in FIGS. 7A, 7B and 7C.

Next, the expose thin oxide 25 is etched selective to polysilicon and photoresist. Areas not protected by the second SiN/photoresist (or hardmask/photoresist combination) are etched by a reactive-ion etching (RIE) process. Shallow isolation trench (SIT) type directional etches may be used at this point of the present invention. The directional active area etching may be done in a single step or a sequential etching procedure may be employed. For a sequential procedure, a polysilicon RIE may first be used to recess the polysilicon placeholder material to a level that is approximately level with the top surface of the Si-containing substrate. Next, the exposed regions of the pad nitride are removed by anisotropic etching. A silicon RIE is then applied to the Si-containing substrate and to the top surface of the polysilicon placeholder material, to define the depth of the isolation trenches. An oxide RIE is thereafter used to recess the top of the collar oxide to the depth of the isolation trenches.

It is noted that in the course of the aforementioned etching processes, the resist (or hardmask/resist) layer over the second SiN layer may be partially consumed. Any remaining resist is stripped utilizing a conventional stripping process. An active area oxidation is performed and another SiN layer is deposited. In the drawings, the new liner provided by these steps is represented by reference numeral 62; the new liner includes oxide and SiN. An oxide fill (TEOS or HDP) is deposited and planarized forming SIT regions 105. The above processing steps lead to the formation of the structure shown in FIGS. 8A, 8B and 8C. The process which formed the SIT regions of the present invention also forms SIT regions in the supports. The SIT regions have depth of from about 100 to about 300 nm, which depth is substantially above the strap region, yet deep enough to cut the bitline diffusion regions. In accordance with the present invention, the SIT regions are typically spaced 1F from each other. Preferably, the SIT width is 2F, which permits the formation of bitlines having a 3F pitch.

Figure 9C:
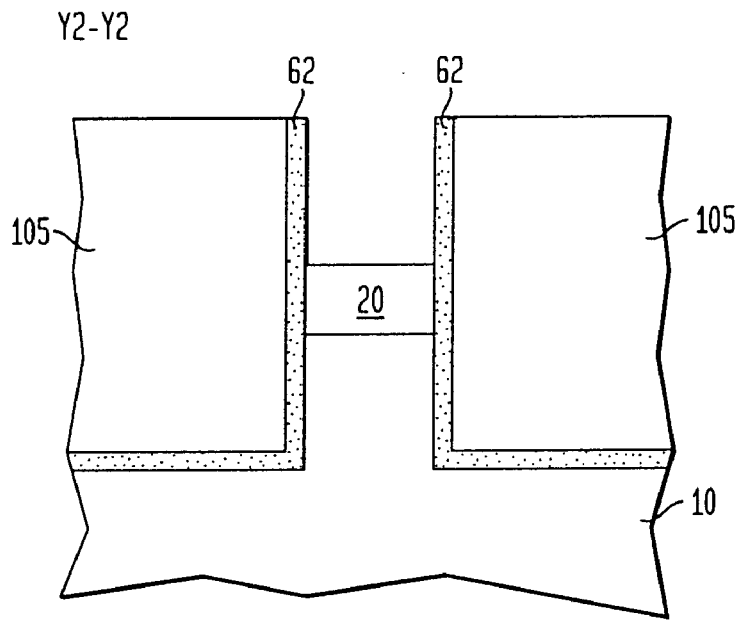
Figure 10A:
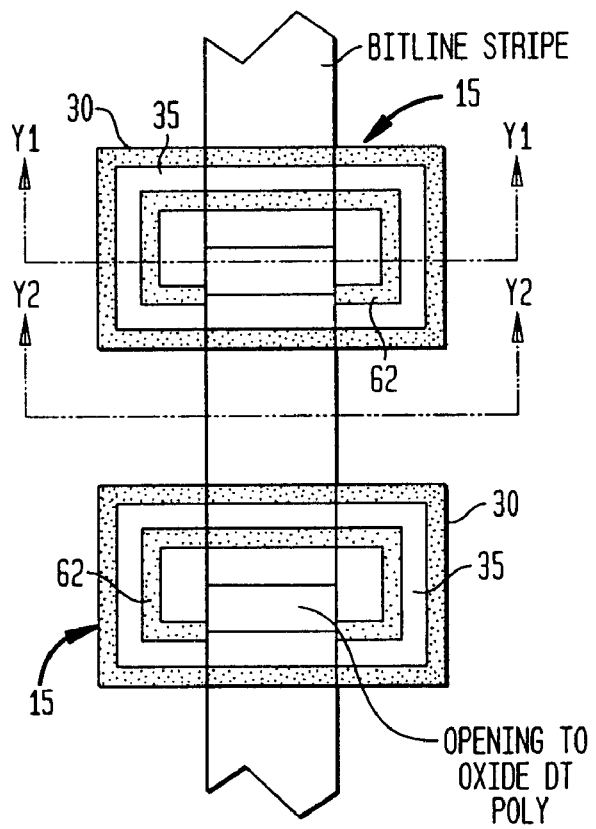
Figure 10B:
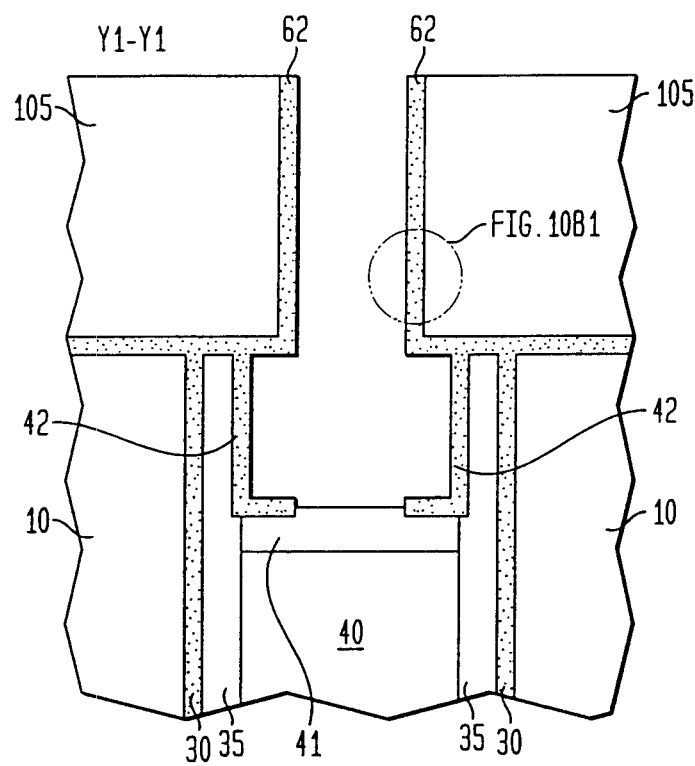
Figure 10B:
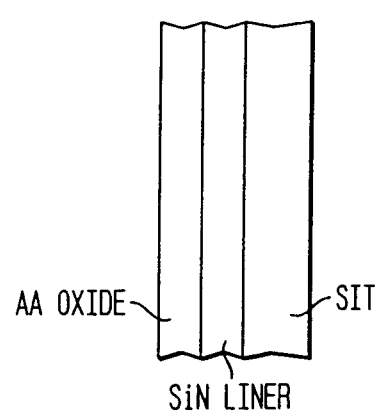
Figure 10C:
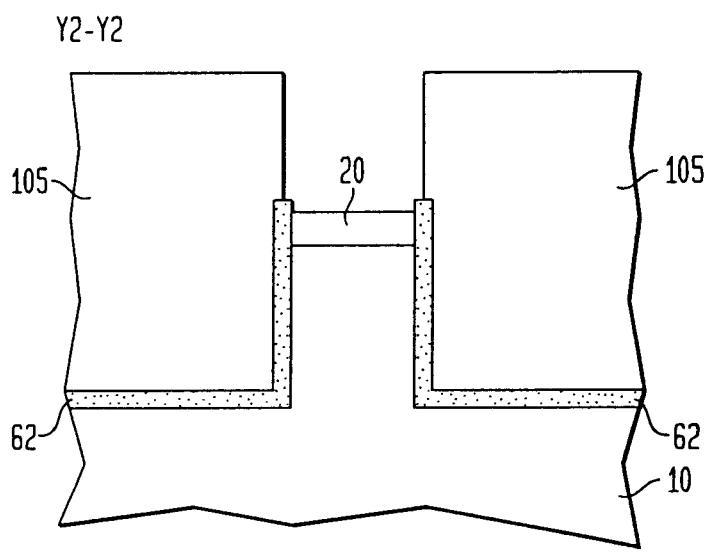

The second SiN layer 45 is etched (RIE) selective to oxide, stopping on the oxide barrier over the polysilicon placeholder material and over the regions of the pad nitride remaining between deep trenches. A short dilute HF etch is then employed to open the thin oxide barrier layer above the placeholder polysilicon material so as to expose the top of the polysilicon placeholder material while leaving portions of the substrate protected by the pad SiN layer in the structure. At this point of the inventive process either a masked or maskless one-sided strap (OSS) process is employed to etch a portion of the polysilicon placeholder material on the side of the deep trench where buried-strap 70 is desired down to the SiN liner overlying the oxide layer at the top of the deep trench polysilicon. The resultant structure after conducting these etching steps is illustrated in FIGS. 9A, 9B and 9C. For example, the OSS process may include the following processing steps: removing a portion of the polysilicon placeholder material using an etch process that is selective to SiN on a side of the deep trench where a strap is to be formed; removing the exposed collar oxide by utilizing an isotropic oxide etching process; removing portions of the SiN liner that are not protected by the remaining region of the polysilicon placeholder material; removing the remaining polysilicon placeholder material; opening a portion of the oxide layer over the deep trench polysilicon not covered by the SiN liner; continuing the oxide etching so as to form a divot in the top collar oxide at approximately the top level of the deep trench polysilicon; and filling the divot with polysilicon so as to provide a bridge between the deep trench polysilicon and the sidewall of the trench.

The opening in the polysilicon placeholder material serves as a mask for the removal of the exposed portion of the SiN liner. Specifically, the exposed portion of the SiN liner is removed utilizing a chemical downstream etching (CDE) process. The remaining polysilicon placeholder material is then removed by utilizing an isotropic etch. The above etching processes, i.e., CDE and isotropic etching, result in the structure shown in FIGS. 10A, 10B, and 10C.

Next, the portion of the collar oxide and oxide above the deep trench polysilicon not protected by the SiN liner are removed by utilizing a conventional isotropic oxide etching process which is selective to SiN. This oxide etch forms a divot in the exposed top portion of the collar oxide in which a strap will later be formed. The collar oxide etch also removes the active area SiN. Optionally, the exposed SiN liner in the interior of the cavity in the deep trench may be removed following the collar oxide etch. This optional step may be needed to avoid the formation of a strap polysilicon vertical stringer between SiN layers on each side of the collar oxide.

Figure 11C:
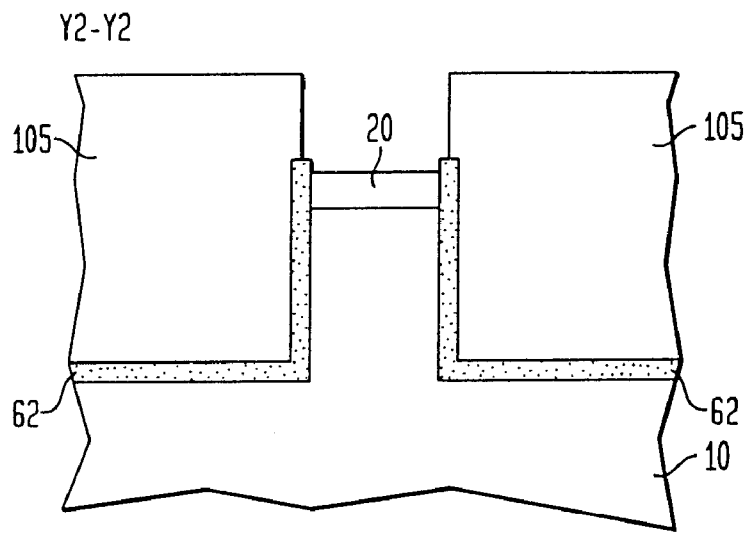

A layer of polysilicon is then deposited so as to fill the divot provided above. Then, the layer of polysilicon is removed from the sidewalls with a conventional isotropic etch (e.g., buried strap polysilicon etch) leaving polysilicon in the collar divot which forms a strap 70 connection bridging the deep trench polysilicon and the deep trench sidewalls. The resultant structure obtained from the above steps is shown in FIGS. 11A, 11B and 11C.

A top trench oxide 85 is formed on portions of the structure utilizing conventional HDP deposition and etching processes. A sacrificial oxide layer is then grown to clean-up the trench sidewalls, then removed, and a gate oxide is then formed on top trench oxide layer 85 by conventional deposition or thermal growing processes. Since both layers are composed of oxides and since the gate oxide is thin, reference numeral 85 is used in the remaining drawings to denote both the top trench oxide and the gate oxide. It is, however, again emphasized that the gate oxide is formed over top trench oxide 85 in the present invention. Next, an N+ doped gate conductor is deposited by conventional techniques and the deposited gate conductor 95 is planarized (chemical-mechanical polishing (CMP)) to the top of the trench top oxide, See FIGS. 12A, 12B, and 12C. Note that buried-strap outdiffusion 70 is formed during these steps of the present invention.

Figure 12A:
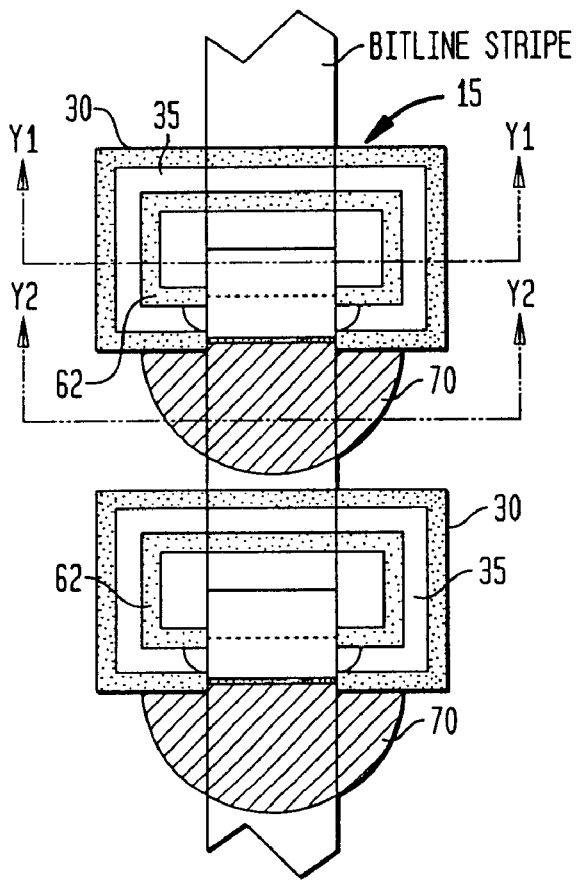
Figure 12B:
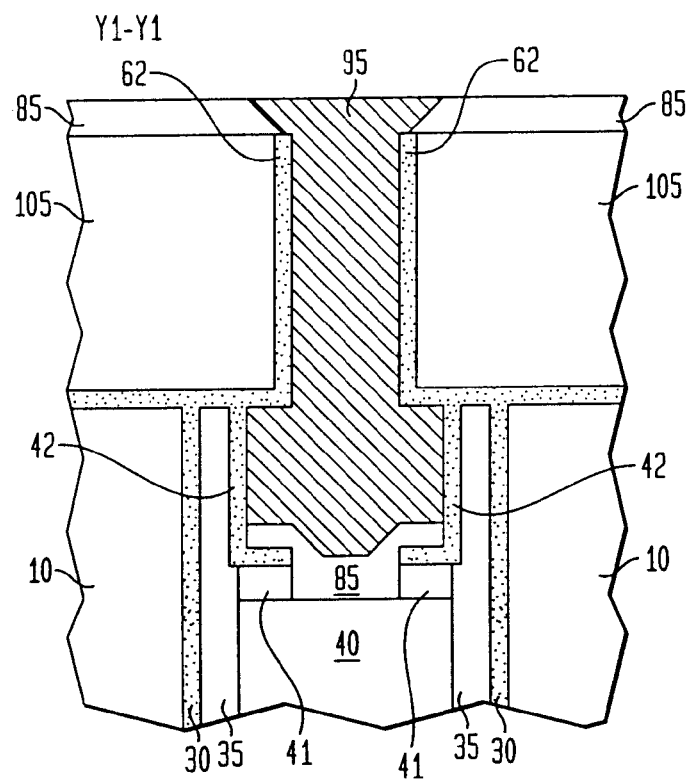
Figure 12C:
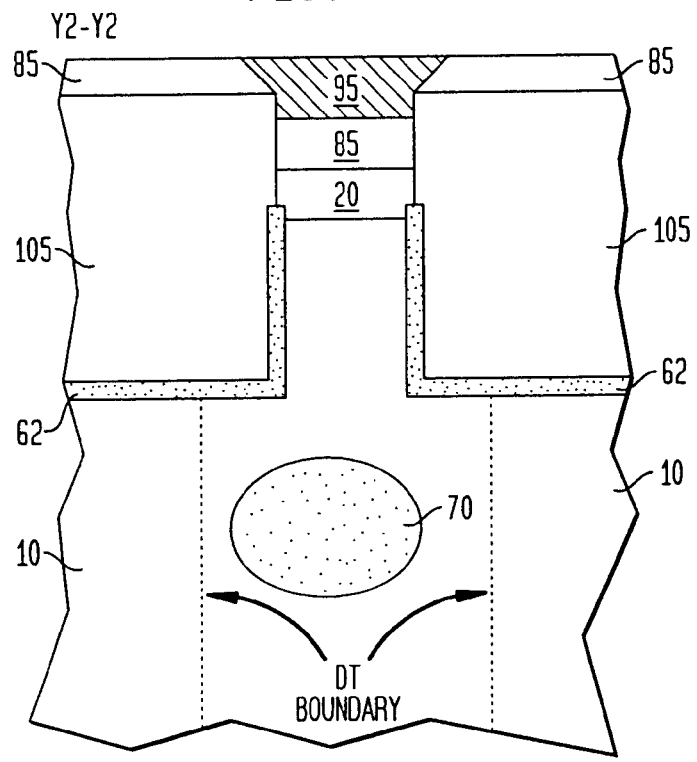
Figure 13A:
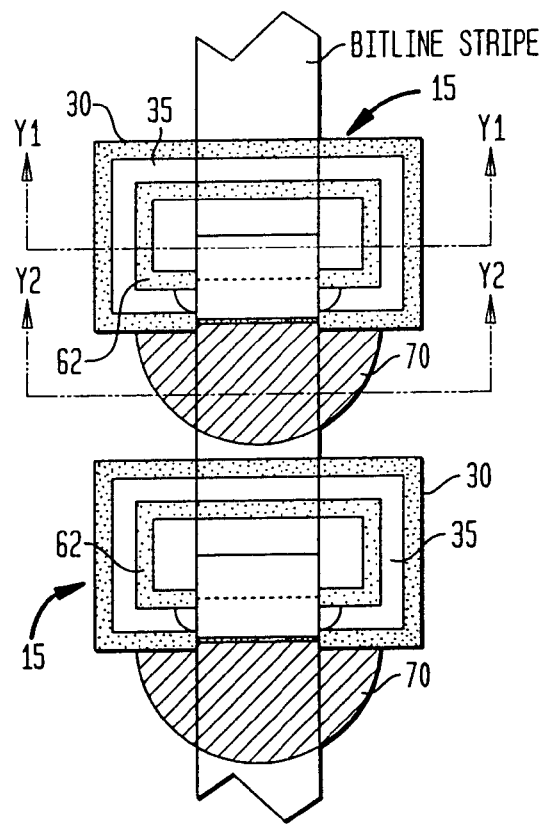
Figure 13B:
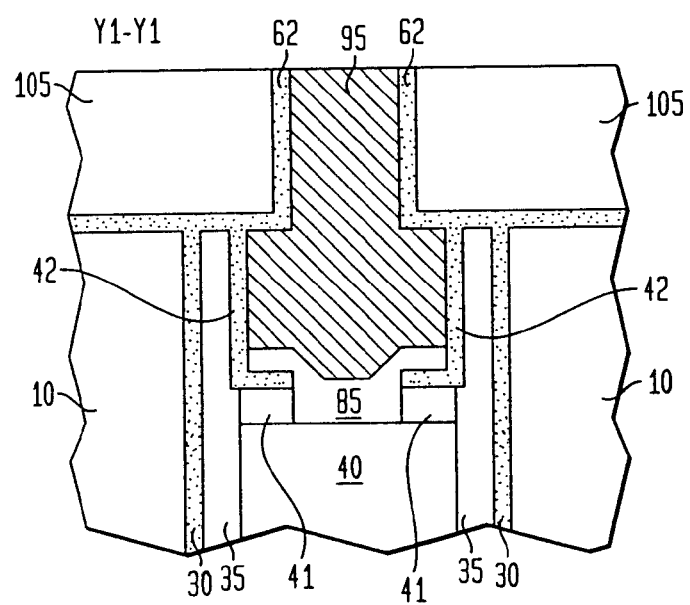
Figure 13C:
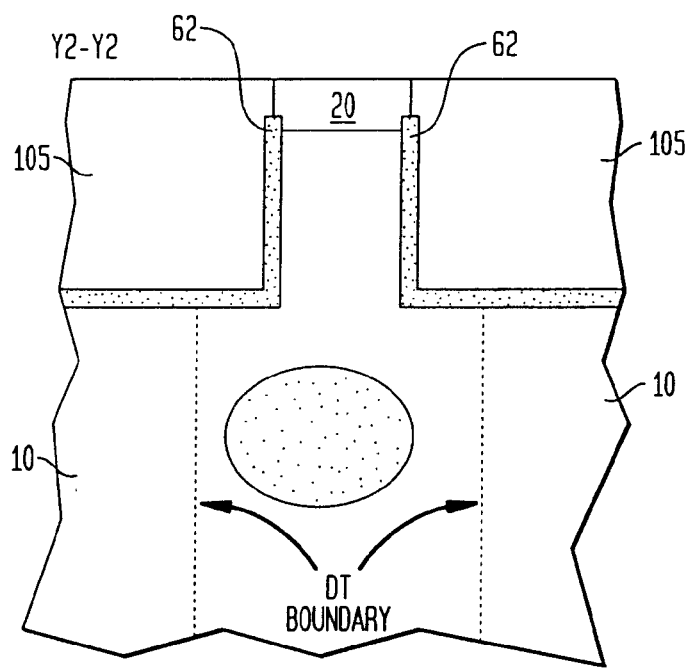
Figure 14A:
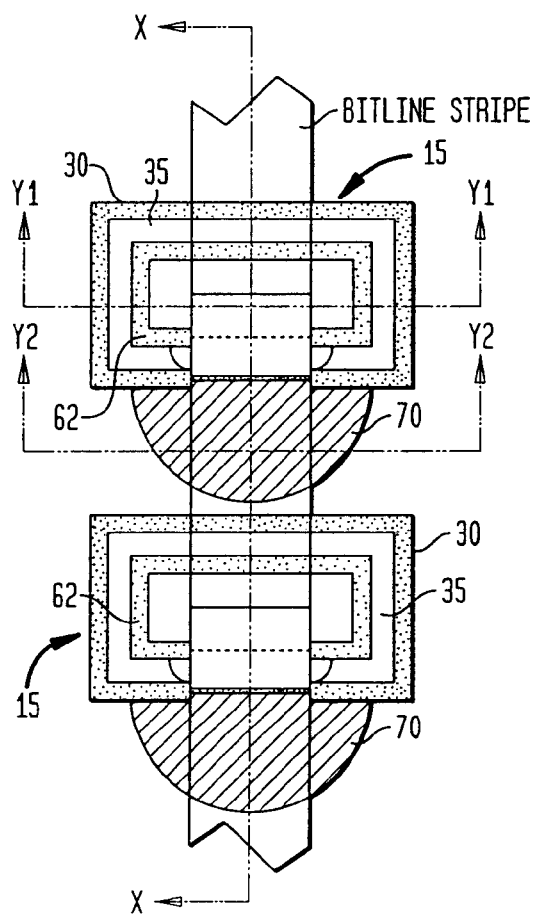
Figure 14B:
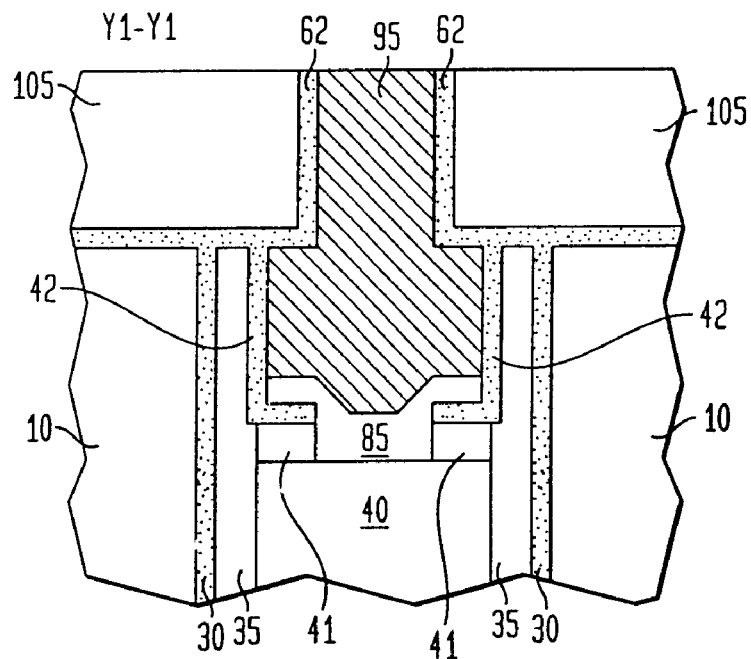
Figure 14C:
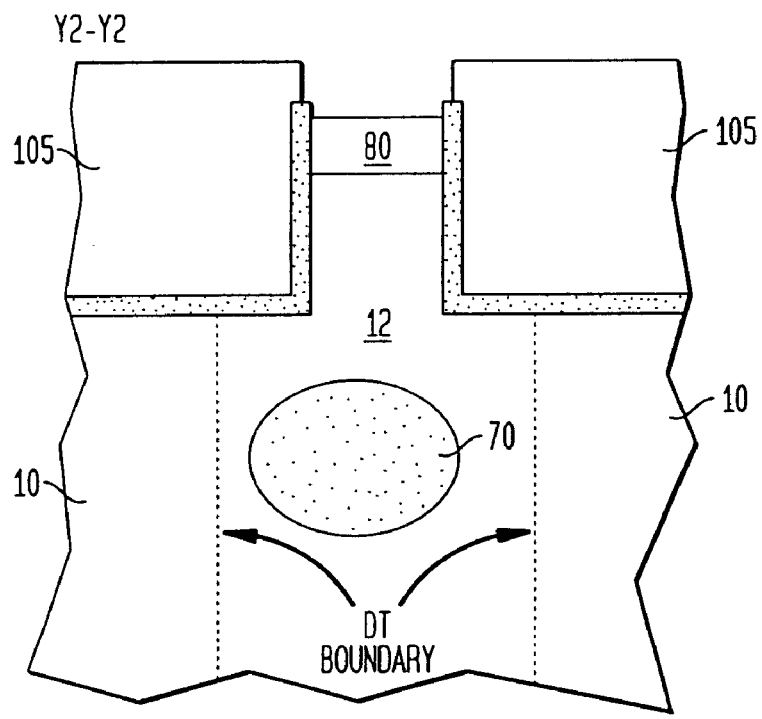
Figure 14D:
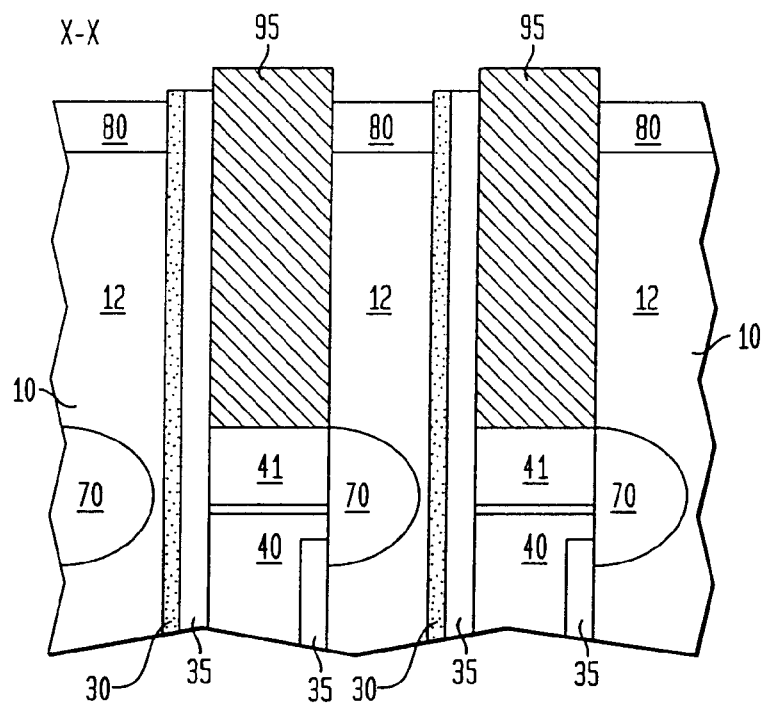
Figure 15A:
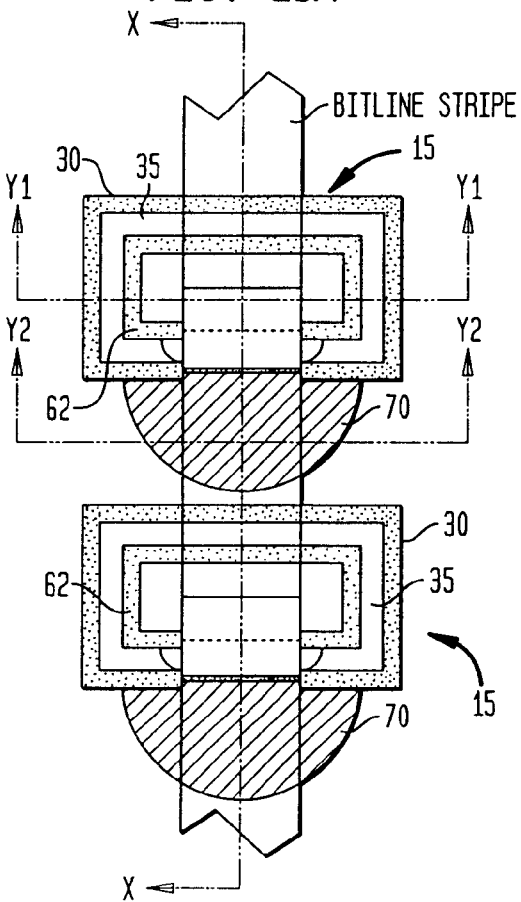
Figure 15B:
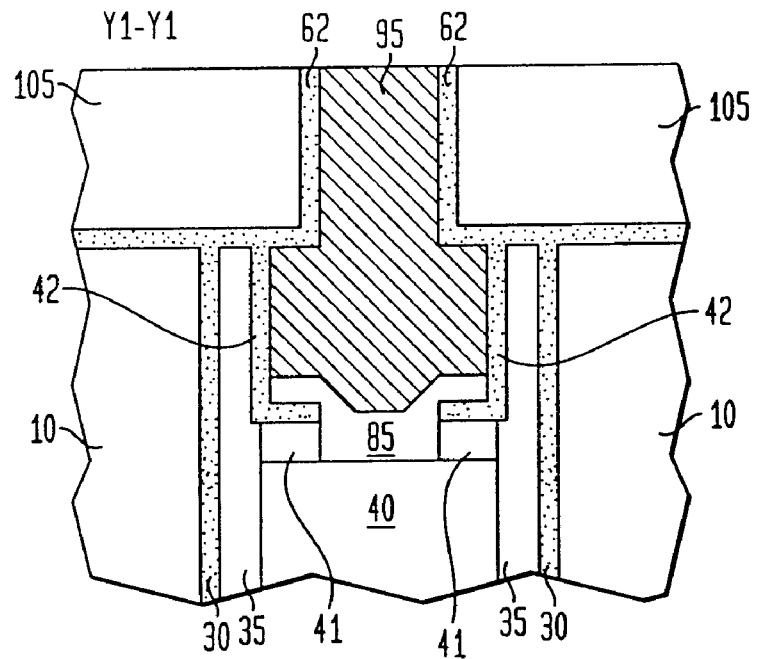
Figure 15C:
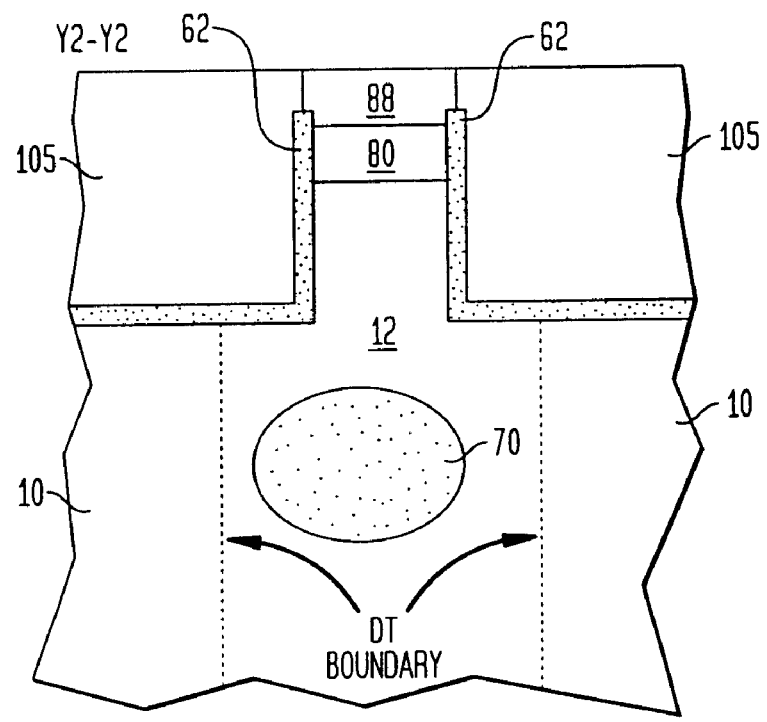
Figure 15D:
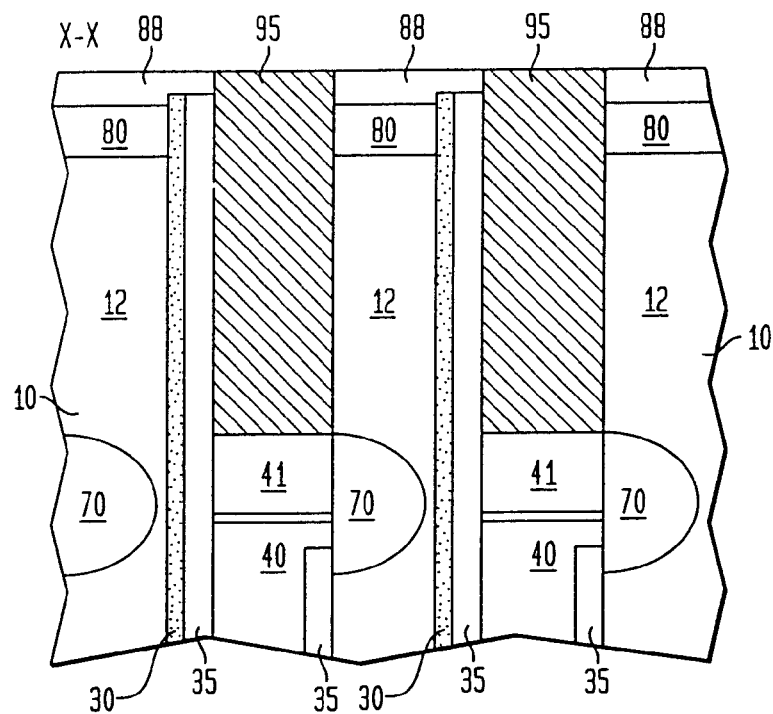
Figure 16A:
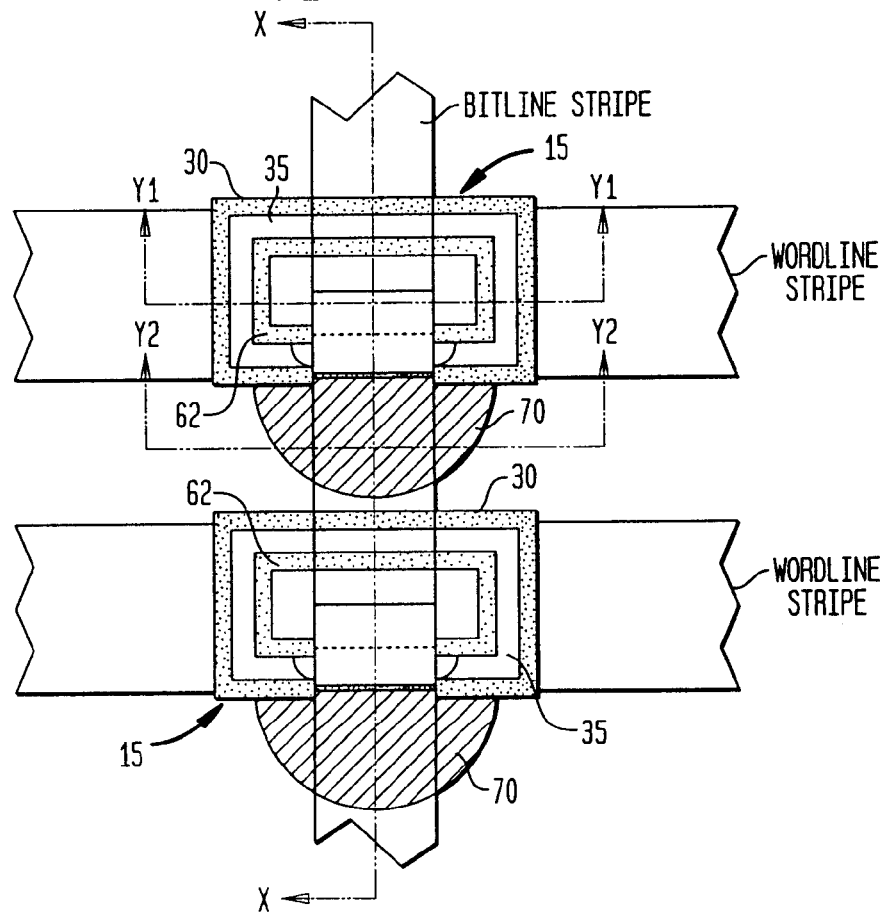
Figure 16B:
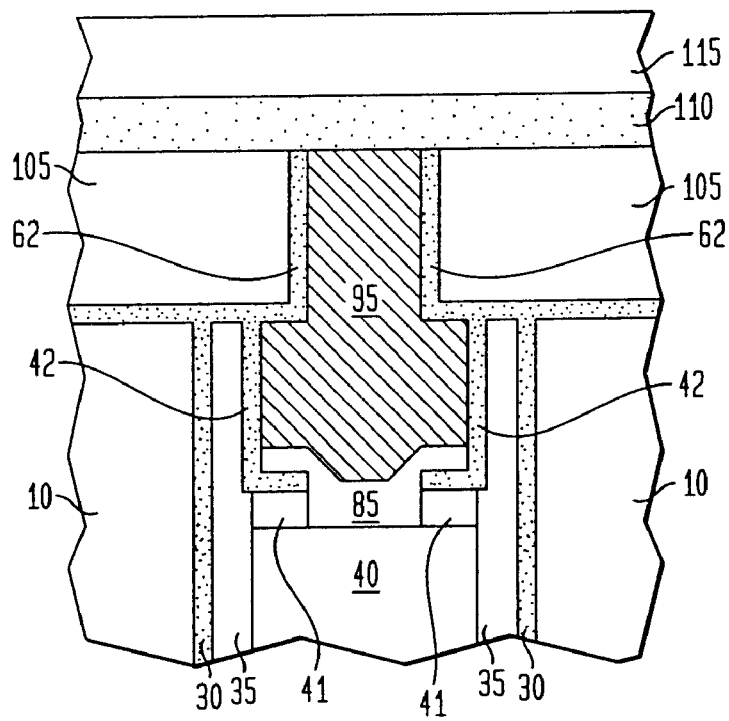
Figure 16C:
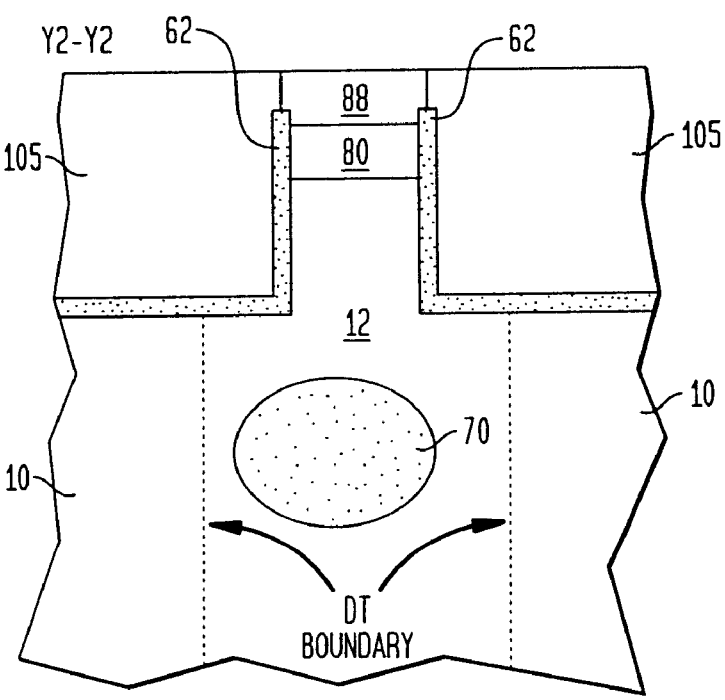
Figure 16D:
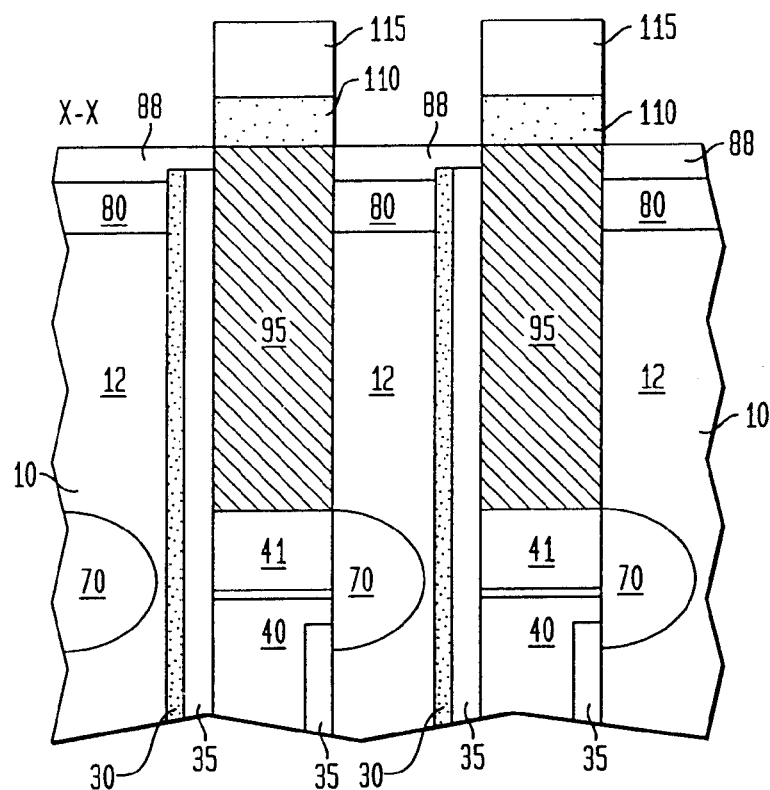
Figure 17A:
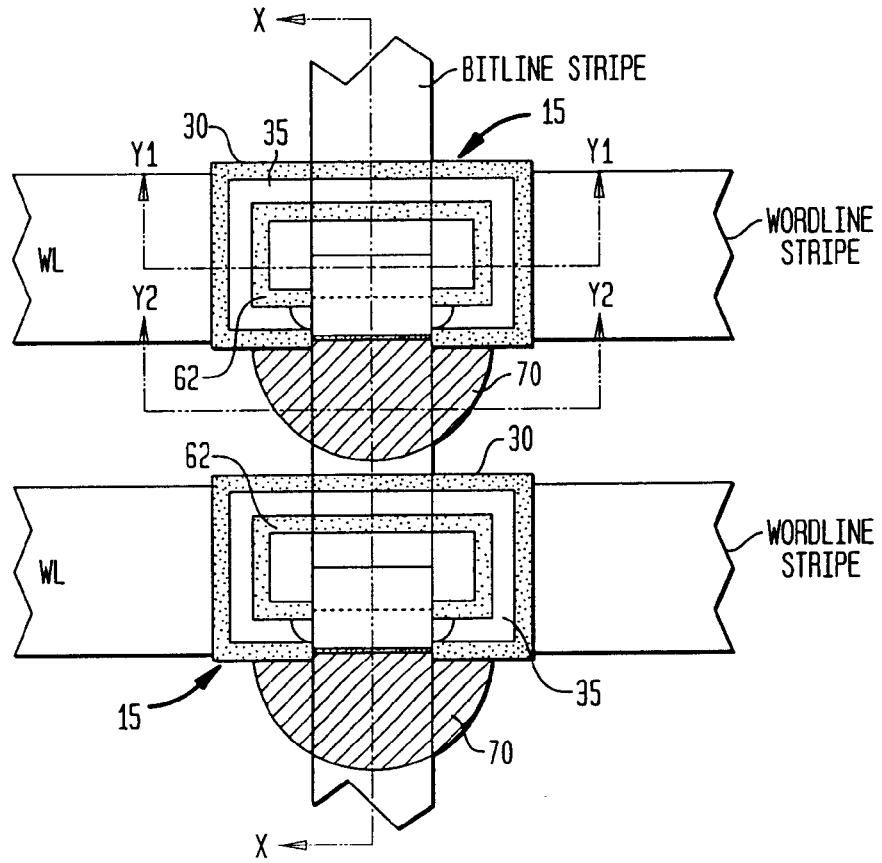
Figure 17B:
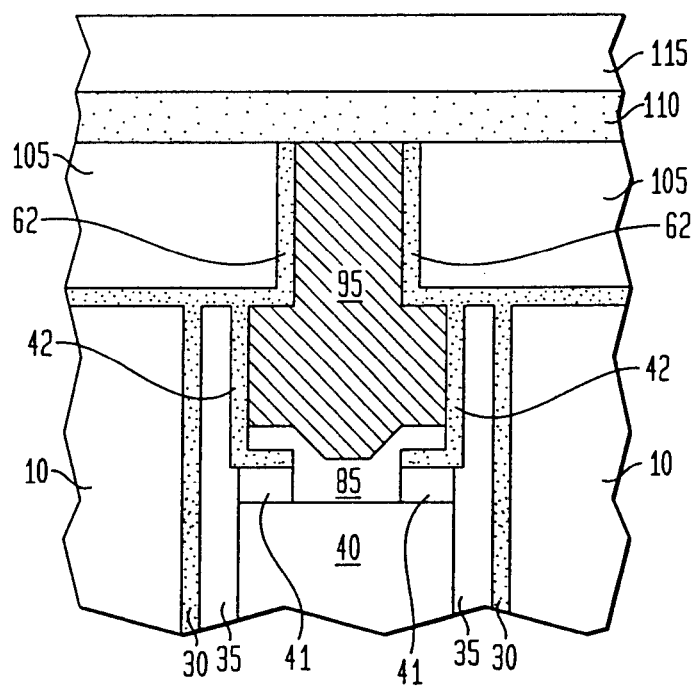
Figure 17C:
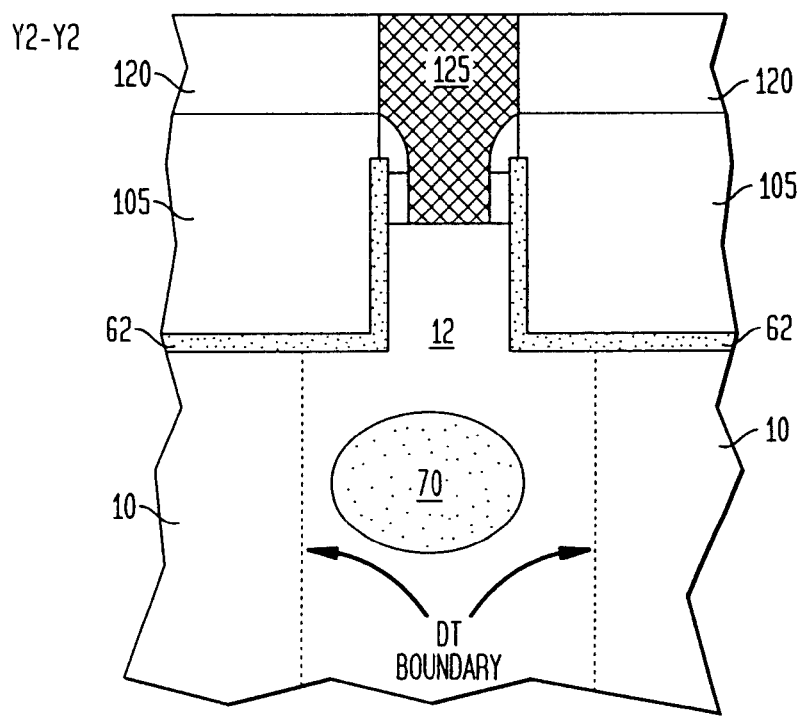
Figure 17D:
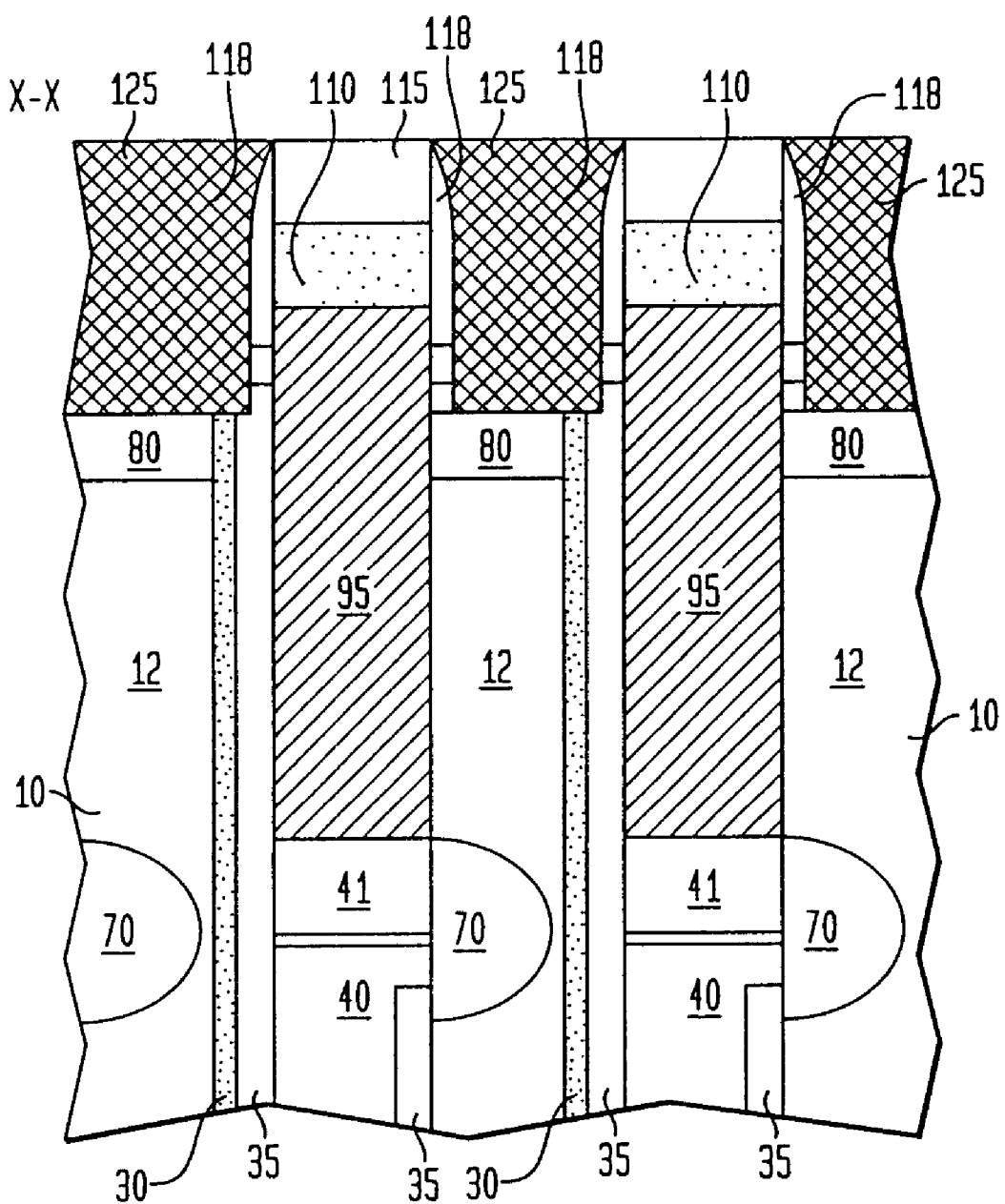

Following formation of the structure shown in FIGS. 12A, 12B and 12C, a conventional planarization process is used to removed the trench top oxide and gate conductor leaving the surface of the pad nitride layer 20 between the exposed deep trenches. It is noted that the planarization process may however remove part of the pad SiN layer. The planarized structure is shown in FIGS. 13A, 13B, and 13C.

Next, and as shown in FIGS. 14A, 14B, 14C and 14D, the SiN pad layer is removed utilizing an etching process that is selective to oxide and polysilicon. A screen oxide (not shown) is then grown and array well and N+bitline diffusions 80 are implanted. It is noted that during this point of the present invention, P-well region 12 is formed in substrate 10.

Following formation of N+ bitline diffusions 80, the screen oxide is removed by a conventional etching process and a layer of CVD oxide 88 is deposited and planarized to the top of the gate conductor so as to expose the gate conductor, but to cover the silicon surface between deep trenches. This structure is shown in FIGS. 15A, 15B, 15C and 15D. It is noted that the gate conductor is used in the above instance as an etch stop layer. At this point of the present invention, a thin protective nitride layer 99 is deposited over all exposed surfaces of the structure. The protective nitride layer is then selectively patterned by conventional lithography and etching, i.e., RIE, so as to expose the support area of the structure while protecting the array arrays during standard support processing. Support device processes may include sacrificial oxidation, well implants, growth of a gate oxide and deposition of a support gate polysilicon layer. The support gate polysilicon is removed from the array selective to the thin protecting nitride layer and thereafter the protective nitride layer is stripped, leaving the top surface of the array gate conductor exposed.

A wordline/gate conductor wiring layer stack consisting of a conductive portion 110, such as W and WN layers or a WSiX layer, and an insulating cap 115, e.g., SiN, is formed by conventional deposition processes. As is well known to those skilled in the art, the insulating cap is required to subsequently form borderless bitline contacts to the wordline gate conductor. The wordline/gate conductor wiring stack is then patterned by lithography and etching into wordlines, See FIGS. 16A, 16B, 16C and 16D.

Following the formation of the wordlines, insulating spacers 118 are formed on the sidewalls of the wordlines utilizing conventional deposition and etching. A thin etch stop layer comprised of SiN (not shown) and a planarizing doped glass layer 120 such as boron phosphorus doped silicate glass (BPSG) are then deposited and the doped glass layer is polished to the insulating cap. Contact vias are patterned and etched selective to SiN in the doped glass layer, stopping on the thin nitride barrier layer (not shown). The exposed portion of the nitride barrier layer is removed and oxide RIE'd through the trench top oxide to the surface of the Si-containing substrate is resumed. Next, N+doped polysilicon is deposited so as to fill the vias and planarized to the top surface of the doped glass layer. These thus formed polysilicon studs 125 (e.g., borderless bitline contacts) will form connection between the bitline diffusions and the bitline conductors to be subsequently formed, See FIGS. 17A, 17B, 17C and 17D. Standard processing continues through final levels of metallization.

In summary, the above process steps results in the formation of a hybrid-type cell (6F$^2$) which avoids strap-to-strap leakage problems to F=60 nm at $V_{blh}$=1.5 V. Moreover, the inventive process results in a well contact scheme which eliminates the floating-well effects which limit the scaling of the conventional hybrid cell. Furthermore, the inventive process uses SIT regions throughout the chip (array and supports) for reduced aspect ratio and ease of fabrication, and it allows for tighter support circuitry groundrules due to smaller aspect ratio SITs. Additionally, the inventive process provides limited area strap aperture defined by side-oxide regions in the storage trench which results in reduced sensitivity to the channel width, and it allows spacing between SIT regions greater than about 1F, if desired, without critical overlay concerns since the strap cut is no longer defined by the SIT region.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a memory array comprising the steps of:
   (a) forming at least one deep trench capacitor in a Si-containing substrate, said at least one deep trench capacitor including at least a deep trench polysilicon material, a trench oxide formed on said deep trench polysilicon material, a liner formed on said trench oxide and interior walls of a collar oxide region; and a polysilicon placeholder material formed on the liner;
   (b) patterning said polysilicon placeholder material using at least a hardmask to cover a middle portion of said deep trench capacitor;
   (c) etching areas not covered by said hard mask and forming a oxide/nitride liner on all exposed surfaces provided by said etching;
   (d) forming a planarized layer of oxide fill in said etched areas on said oxide/nitride liner so as to form shallow isolation trench regions which have a depth that is substantially above a buried-strap outdiffiision region to be subsequently formed thereby not cutting into said buried-strap outdiffusion region, yet being deep enough to isolation adjacent bitline diffusion regions to be subsequently formed;
   (e) removing said hard mask from said middle portion of the deep trench capacitor, and selectively etching through a portion of said polysilicon placeholder material, liner and trench oxide so as to expose a portion of said deep trench polysilicon material;
   (f) providing a strap opening in said deep trench capaciton forming a one-sided buried-strap outdiffiusion region through said strap opening, said one-sided buried strap outdiffusion region being confined to a substantially center portion of the deep trench capacitor;
   (g) forming a trench oxide so as to cover said exposed deep trench polysilicon material and forming a planarized gate conductor material in previous etched areas of said deep trench; and
   (h) forming bitline difflusion regions about said deep trench capacitor.

2. The process of claim 1 further comprising forming wordlines above said deep trench capacitor, forming borderless bitline contacts adjacent to said wordlines and forming bitlines above and parallel to said wordline that are in contact with said bitline contacts.

3. The process of claim 2 wherein said bitlines have approximately a 3F pitch.

4. The process of claim 2 wherein said wordlines include a conductive portion and an insulating cap formed on said conductive portion.

5. The process of claim 4 wherein said conductive portions includes W/WN layers or $WSi_x$ layers.

6. The process of claim 4 wherein said insulating cap is comprised of SiN.

7. The process of claim 2 wherein said wordlines include spacers formed on sidewalls thereof.

8. The process of claim 1 wherein said deep trench capacitor is formed by the steps of: forming a pad structure on said Si-containing substrate; patterning said pad structure via lithography; etching a deep trench into said Si-ontaining substrate; forming a liner on exposed interior walls of said deep trench; forming an oxide collar on sidewalls of said liner; forming a buried plate diffusion region in a lower portion of said deep trench; forming a node dielectric about said buried plate diffusion region; forming a recessed deep trench polysilicon material layer in said deep trench; forming an trench oxide on said recessed deep trench polysilicon material; lining exposed walls of said collar oxide and said trench oxide with a second liner; and forming a polysilicon placeholder material layer on said second liner.

9. The process of claim 1 wherein step (b) includes lithography and etching.

10. The process of claim 1 wherein step (c) includes a reactive-ion etching which is selective to said liner.

11. The process of claim 1 wherein said oxide fill is comprised of tetraethylorthosilicate or high density plasma oxide.

12. The process of claim 1 wherein said shallow isolation trench regions have a depth of from about 100 to about 300 nm.

13. The process of claim 1 wherein step (f) includes a one-sided strap process.

14. The process of claim 13 wherein said one-sided strap process includes removing a portion of the polysilicon placeholder material using an etch process that is selective to said liner on a side of the deep trench where a strap is to be formed; removing the exposed collar oxide by utilizing an isotropic oxide etching process; removing a portion of the liner that is not protected by the remaining region of the polysilicon placeholder material; removing the remaining polysilicon placeholder material; opening a portion of the oxide layer over the deep trench polysilicon not covered by the liner; continuing the oxide etching so as to form a divot in the top collar oxide at approximately the top level of the deep trench polysilicon; and filling the divot with polysilicon so as to provide a bridge between the deep trench polysilicon and the sidewall of the trench.

15. The process of claim 1 wherein said bitline diffuisions are formed by implantation.

* * * * *